United States Patent
Ito et al.

(10) Patent No.: US 12,199,057 B2
(45) Date of Patent: Jan. 14, 2025

(54) SEMICONDUCTOR DEVICE

(71) Applicant: Nuvoton Technology Corporation Japan, Kyoto (JP)

(72) Inventors: Yusuke Ito, Kyoto (JP); Takahiro Maeda, Niigata (JP); Akira Kimura, Kyoto (JP); Tsubasa Inoue, Osaka (JP); Masahiro Mitsuda, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/790,739

(22) Filed: Jul. 31, 2024

(65) Prior Publication Data
US 2024/0395749 A1    Nov. 28, 2024

Related U.S. Application Data

(63) Continuation of application No. PCT/JP2023/037194, filed on Oct. 13, 2023.
(Continued)

(51) Int. Cl.
*H01L 23/00* (2006.01)
*H01L 29/06* (2006.01)
(Continued)

(52) U.S. Cl.
CPC .......... *H01L 24/06* (2013.01); *H01L 29/0696* (2013.01); *H01L 29/7805* (2013.01);
(Continued)

(58) Field of Classification Search
CPC . H01L 24/06; H01L 29/0696; H01L 29/7805; H01L 29/7809; H01L 29/7813;
(Continued)

(56) References Cited

U.S. PATENT DOCUMENTS 10,069,002 B2   9/2018  Jeon et al.
2010/0013008 A1  1/2010  Oikawa
(Continued)

FOREIGN PATENT DOCUMENTS

JP   2010-092895 A   4/2010
JP   2016-164962 A   9/2016
(Continued)

OTHER PUBLICATIONS

International Search Report dated Dec. 19, 2023 issued in International Patent Application No. PCT/JP2023/037194, with English translation.
(Continued)

*Primary Examiner* — Robert G Bachner
(74) *Attorney, Agent, or Firm* — Rimon P.C.

(57) ABSTRACT

A semiconductor device includes: a transistor provided in a first region of a semiconductor layer in a plan view; a transistor provided in a second region adjacent to the first region of the semiconductor layer in the plan view; and a drain pad provided in a third region not overlapping the first region and the second region in the plan view. In the plan view, the first region and the second region are one region and an other region that divide an area of the semiconductor layer excluding the third region in half. In the plan view, the transistors are arranged in a first direction. The center of the third region is located on a straight center line that divides the semiconductor layer in half in the first direction and is orthogonal to the first direction. In the plan view, the drain pad is contained in the third region.

12 Claims, 30 Drawing Sheets

Related U.S. Application Data

(60) Provisional application No. 63/419,840, filed on Oct. 27, 2022.

(51) Int. Cl.
  *H01L 29/78* (2006.01)
  *H01M 10/42* (2006.01)
  *H02J 7/00* (2006.01)

(52) U.S. Cl.
  CPC ...... *H01L 29/7809* (2013.01); *H01L 29/7813* (2013.01); *H02J 7/0029* (2013.01); *H01L 2224/06153* (2013.01); *H01M 10/425* (2013.01)

(58) Field of Classification Search
  CPC ........ H01L 2224/06153; H02J 7/0029; H01M 10/425
  See application file for complete search history.

(56) References Cited

U.S. PATENT DOCUMENTS

| | | |
|---|---|---|
| 2016/0254809 A1 | 9/2016 | Mochizuki et al. |
| 2019/0229194 A1 | 7/2019 | Yoshida et al. |
| 2020/0035669 A1 | 1/2020 | Tamaru et al. |
| 2020/0365729 A1 | 11/2020 | Okawa et al. |
| 2020/0388609 A1 | 12/2020 | Yoshida et al. |
| 2021/0233905 A1 | 7/2021 | Yoshida et al. |
| 2022/0157806 A1 | 5/2022 | Yoshida et al. |

FOREIGN PATENT DOCUMENTS

| | | |
|---|---|---|
| JP | 2019-129312 A | 8/2019 |
| JP | 2021-005732 A | 1/2021 |
| KR | 10-2021-0018538 A | 2/2021 |
| WO | 2019/156215 A1 | 8/2019 |

OTHER PUBLICATIONS

Written Opinion of the International Searching Authority dated Dec. 19, 2023 issued in International Patent Application No. PCT/JP2023/037194, with English translation.

Semiconductor Components Industries, LLC, "EFC4C012NL Power MOSFET for 3-Cells Lithium-ion Battery Protection 30 V, 6.5 mΩ, 19 A, Dual N-Channel, WLCSP6" ([URL] https://www.onsemi.com/pdf/datasheet/efc4c012nl-d.pdf), Nov. 2017.

Semiconductor Components Industries, LLC, "MOSFET—Power, Dual, N-Channel, for 3-Cells Lithium-ion Battery Protection, WLCSP8 30 V, 2.6 mΩ, 30 A EFC4C002NL" ([URL] https://www.onsemi.com/pdf/datasheet/efc4c002nl-d.pdf), Sep. 2022.

Korean Office Action dated Aug. 28, 2024 issued in the corresponding Korean Patent Applicatin No. 10-2024-7025036.

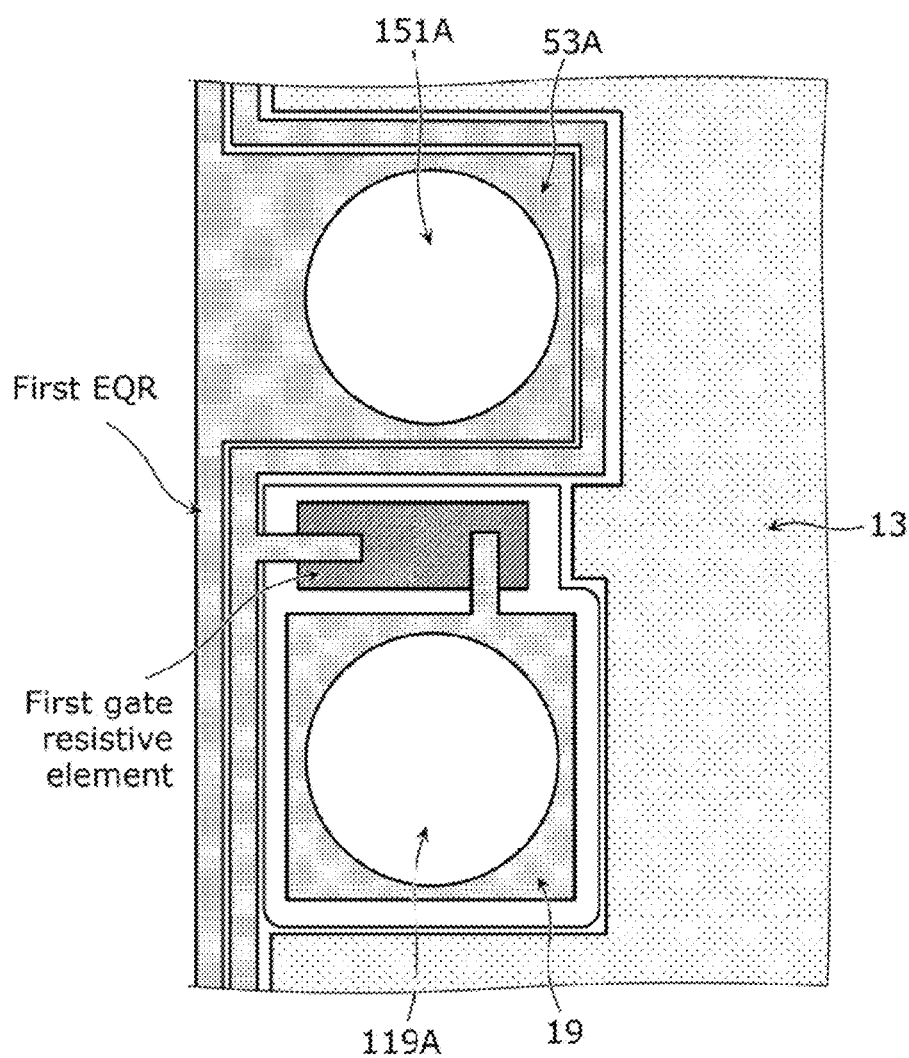

SEMICONDUCTOR DEVICE

CROSS REFERENCE TO RELATED APPLICATIONS

This is a continuation application of PCT International Application No. PCT/JP2023/037194 filed on Oct. 13, 2023, designating the United States of America, which is based on and claims priority of U.S. Provisional Patent Application No. 63/419,840 filed on Oct. 27, 2022. The entire disclosures of the above-identified applications, including the specifications, drawings and claims are incorporated herein by reference in their entirety.

FIELD

The present disclosure relates to a semiconductor device and, in particular, to a chip-size-package type semiconductor device.

BACKGROUND

In a vertical MOS transistor including a dual configuration used for the purpose of blocking conduction before a lithium-ion battery is overcharged or overdischarged, since a current that flows at the time of charging or discharging is relatively large, a reduction of conduction resistance in a conducting state is especially emphasized.

On the other hand, in charging that is performed on a lithium-ion battery that is in a state of overdischarge due to a natural lapse of time etc., causing the charging to start slowly by passing a relatively small current is desirable for safe use of the battery. For this reason, it is useful for a battery protection circuit when a vertical MOS transistor including a dual configuration comes with a pathway that passes a relatively small current.

CITATION LIST

Patent Literature

PTL 1: Japanese Unexamined Patent Application Publication No. 2021-005732A

SUMMARY

Technical Problem

In a vertical MOS transistor including a dual configuration, additionally providing an ancillary pathway in a limited device area may impede an original conduction of charging and discharging current.

Solution to Problem

In order to solve the above-described problem, a semiconductor device according to one aspect of the present disclosure is a facedown mountable, chip-size-package type semiconductor device, the semiconductor device comprising: a semiconductor substrate; a low-concentration impurity layer that is provided on the semiconductor substrate; a first vertical MOS transistor that is provided in a first region of a semiconductor layer that is a combination of the semiconductor substrate and the low-concentration impurity layer; a second vertical MOS transistor that is provided in a second region adjacent to the first region in a plan view of the semiconductor layer; a plurality of first source pads that are provided in the first region in the plan view and connected to a first source electrode of the first vertical MOS transistor; a first gate pad that is provided in the first region in the plan view and connected to a first gate electrode of the first vertical MOS transistor; a plurality of second source pads that are provided in the second region in the plan view and connected to a second source electrode of the second vertical MOS transistor; a second gate pad that is provided in the second region in the plan view and connected to a second gate electrode of the second vertical MOS transistor; and a metal layer that is provided in contact with a back surface of the semiconductor substrate, wherein the semiconductor substrate is a common drain region for the first vertical MOS transistor and the second vertical MOS transistor, in the plan view, the semiconductor layer is in a rectangular shape, in the plan view, the first vertical MOS transistor and the second vertical MOS transistor are arranged in a first direction, in the plan view, the semiconductor layer includes a third region that does not overlap the first region and the second region, in the plan view, the first region and the second region are one region and an other region that divide an area of a region of the semiconductor layer excluding the third region in half, in the plan view, a center of the third region is located on a center line that is straight and orthogonal to the first direction and divides the semiconductor layer in half in the first direction, in the plan view, the semiconductor layer includes one drain pad that is connected to the common drain region, and in the plan view, the one drain pad is contained in the third region.

In order to solve the above-described problem, a semiconductor device according to one aspect of the present disclosure is a facedown mountable, chip-size-package type semiconductor device, the semiconductor device comprising: a semiconductor substrate; a low-concentration impurity layer that is provided on the semiconductor substrate; a first vertical MOS transistor that is provided in a first region of a semiconductor layer that is a combination of the semiconductor substrate and the low-concentration impurity layer; a second vertical MOS transistor that is provided in a second region adjacent to the first region in a plan view of the semiconductor layer; a plurality of first source pads that are provided in the first region in the plan view and connected to a first source electrode of the first vertical MOS transistor; a first gate pad that is provided in the first region in the plan view and connected to a first gate electrode of the first vertical MOS transistor; a first drain pad that is provided in the first region in the plan view and connected to a first drain electrode of the first vertical MOS transistor; a plurality of second source pads that are provided in the second region in the plan view and connected to a second source electrode of the second vertical MOS transistor; a second gate pad that is provided in the second region in the plan view and connected to a second gate electrode of the second vertical MOS transistor; a second drain pad that is provided in the second region in the plan view and connected to a second drain electrode of the second vertical MOS transistor; and a metal layer that is provided in contact with a back surface of the semiconductor substrate, wherein the semiconductor substrate is a common drain region for the first vertical MOS transistor and the second vertical MOS transistor, in the plan view, the semiconductor layer is in a rectangular shape, in the plan view, the first region and the second region are one region and an other region that divide an area of the semiconductor layer in half, in the plan view, a middle point of a line segment that connects a center of the first gate pad and a center of the second gate pad is located on a border line between the first region and the second region, in the plan view, a middle point of a line segment that connects a center of the first drain pad and a center of the second drain pad is located on the border line, none of the plurality of first source pads is disposed between the first gate pad and the first drain pad, and none of the plurality of second source pads is disposed between the second gate pad and the second drain pad.

In order to solve the above-described problem, a semiconductor device according to one aspect of the present disclosure is a facedown mountable, chip-size-package type semiconductor device, the semiconductor device comprising: a semiconductor substrate; a low-concentration impurity layer that is provided on the semiconductor substrate; a first vertical MOS transistor that is provided in a first region of a semiconductor layer that is a combination of the semiconductor substrate and the low-concentration impurity layer; a second vertical MOS transistor that is provided in a second region adjacent to the first region in a plan view of the semiconductor layer; a plurality of first source pads that are provided in the first region in the plan view and connected to a first source electrode of the first vertical MOS transistor; a first gate pad that is provided in the first region in the plan view and connected to a first gate electrode of the first vertical MOS transistor; a first drain pad that is provided in the first region in the plan view and connected to a first drain electrode of the first vertical MOS transistor; a plurality of second source pads that are provided in the second region in the plan view and connected to a second source electrode of the second vertical MOS transistor; a second gate pad that is provided in the second region in the plan view and connected to a second gate electrode of the second vertical MOS transistor; a second drain pad that is provided in the second region in the plan view and connected to a second drain electrode of the second vertical MOS transistor; and a metal layer that is provided in contact with a back surface of the semiconductor substrate, wherein the semiconductor substrate is a common drain region for the first vertical MOS transistor and the second vertical MOS transistor, in the plan view, the semiconductor layer is in a rectangular shape, in the plan view, the first region and the second region are one region and an other region that divide an area of the semiconductor layer in half, in the plan view, a middle point of a line segment that connects a center of the first drain pad and a center of the second drain pad is located on a border line between the first region and the second region, in the plan view, at least part of the plurality of first source pads are disposed between the first drain pad and the border line, and in the plan view, at least part of the plurality of second source pads are disposed between the second drain pad and the border line.

Advantageous Effects

The above-described configurations make it possible to provide, in one device, a secondary pathway that passes a relatively small current without interrupting conduction of a primary pathway that passes a relatively large current as much as possible, in a vertical MOS transistor including a dual configuration that is capable of controlling bidirectional conduction.

As stated above, the present disclosure makes it possible to provide, in one device, a secondary pathway that passes a relatively small current without interrupting conduction of a primary pathway that passes a relatively large current as much as possible.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 12C is a plan view illustrating an example of an enlarged drain electrode portion and an enlarged gate electrode portion of the semiconductor device according to Embodiment 2.

DESCRIPTION OF EMBODIMENTS

The embodiments described below each show a specific example of the present disclosure. The numeral values, shapes, materials, constituent elements, the arrangement and connection of the constituent elements, etc. indicated in the following embodiments are mere examples, and therefore do not intend to limit the present disclosure.

In the present disclosure, the expression "A and B are electrically connected" includes a case in which A and B are directly connected via a wire, a case in which A and B are directly connected without a wire, and a case in which A and B are indirectly connected via a resistive component (a resistive element, a resistive wire).

Embodiment 1

[1. Structure of Semiconductor Device]

Hereinafter, a structure of a semiconductor device according to Embodiment 1 is described. The semiconductor device according to Embodiment 1 is a facedown mountable, chip-size-package (CSP) type semiconductor device in which two vertical metal-oxide semiconductor (MOS) transistors are provided on a semiconductor substrate. The above-described two vertical MOS transistors are power transistors and what is called trench MOS field-effect transistors (FETs).

Figure 1:
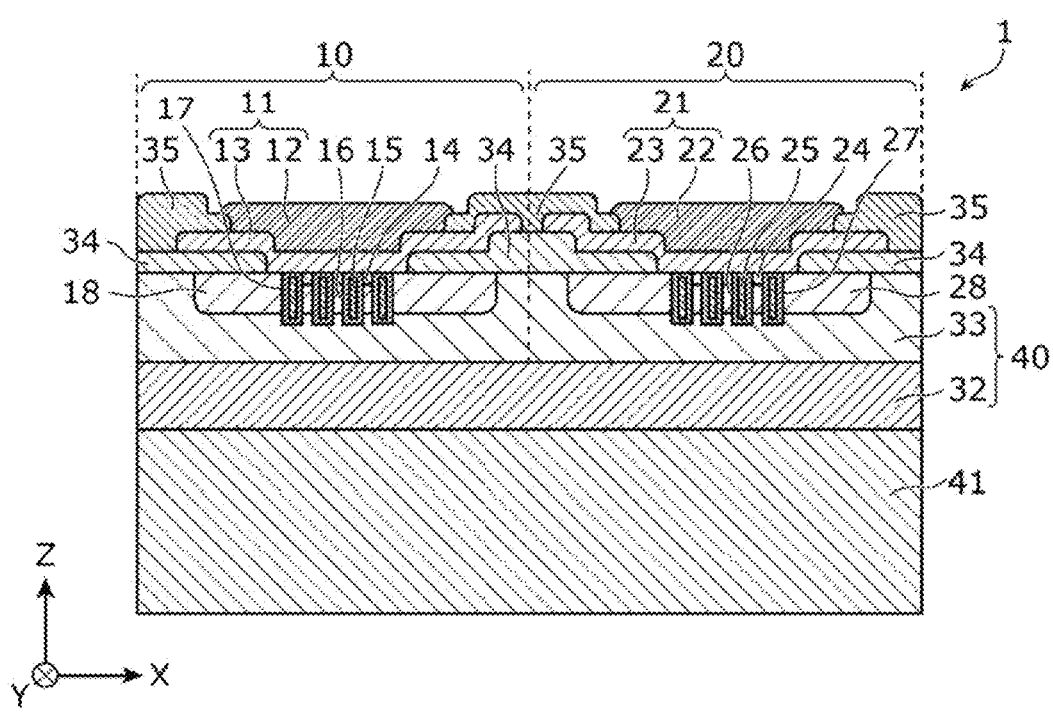
FIG. 1 is a cross-sectional view illustrating an example of a structure of a semiconductor device according to Embodiment 1.
Figure 2A:
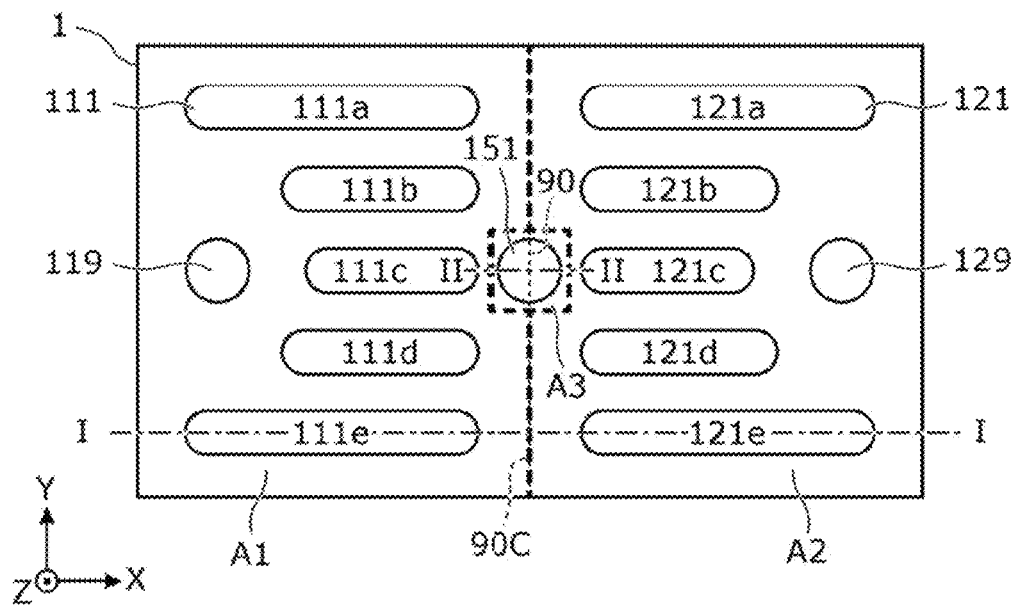
FIG. 2A is a plan view illustrating an example of an arrangement of pads in the semiconductor device according to Embodiment 1.

FIG. 1 is a cross-sectional view illustrating an example of a structure of semiconductor device 1 according to Embodiment 1. FIG. 2A is a plan view illustrating an example of an arrangement of pads in semiconductor device 1. The size and shape of semiconductor device 1 are an example except that semiconductor device 1 is in a rectangular shape. Additionally, the sizes, shapes, and arrangement of the pads are also an example.

FIG. 1 is a cross-sectional view taken along line I-I of FIG. 2A.

As shown in FIG. 1 and FIG. 2A, semiconductor device 1 includes: semiconductor layer 40; metal layer 41; first vertical MOS transistor 10 (hereinafter also referred to as transistor 10) that is provided in first region A1 in semiconductor layer 40; second vertical MOS transistor 20 (hereinafter also referred to as transistor 20) that is provided in second region A2 in semiconductor layer 40; and third region A3 that does not overlap first region A1 and second region A2.

In the present disclosure, a semiconductor layer provided on semiconductor substrate 32 is referred to as semiconductor layer 40 with the inclusion of semiconductor substrate 32. Semiconductor layer 40 is configured by stacking semiconductor substrate 32 and low-concentration impurity layer 33. Semiconductor substrate 32 is disposed on a back surface side of semiconductor layer 40, and includes silicon containing impurities of a first conductivity type. Low-concentration impurity layer 33 is an impurity layer of the first conductivity type that is disposed on a front surface side of semiconductor layer 40, in contact with semiconductor substrate 32, and contains impurities of the first conductivity type having a concentration lower than a concentration of the impurities of the first conductivity type contained in semiconductor substrate 32. Low-concentration impurity layer 33 may be provided on semiconductor substrate 32 by, for example, epitaxial growth.

Metal layer 41 is provided in contact with the back surface side of semiconductor layer 40, and includes silver (Ag) or copper (Cu). It should be noted that metal layer 41 may include a trace amount of chemical element other than metal mixed in as impurities in a step of manufacturing a metal material. Moreover, metal layer 41 may or may not be provided on an entire surface on the back surface side of semiconductor layer 40.

As shown in FIG. 1 and FIG. 2A, first body region 18 of a second conductivity type containing impurities of the second conductivity type is provided in first region A1 of low-concentration impurity layer 33, the second conductivity type being different from the first conductivity type. First source region 14 of the first conductivity type containing impurities of the first conductivity type is provided in first body region 18. In first region A1, a plurality of first gate trenches 17 that penetrate through first source region 14 and first body region 18 from a top surface of semiconductor layer 40 to a depth that reaches a portion of low-concentration impurity layer 33 are provided, and first gate conductor 15 is further provided on first gate insulating film 16 inside each of the plurality of first gate trenches 17.

First source electrode 11 includes portion 12 and portion 13. Portion 12 is connected to first source region 14 and first body region 18 via portion 13. First gate conductor 15 is an embedded gate electrode embedded inside semiconductor layer 40, and is electrically connected to first gate pad 119.

Portion 12 of first source electrode 11 is a layer joined with solder at the time of reflow in facedown mounting, and may comprise a metal material including at least one of nickel, titanium, tungsten, or palladium as a non-limiting example. The surface of portion 12 may be plated with gold etc.

Portion 13 of first source electrode 11 is a layer that connects portion 12 and semiconductor layer 40, and may comprise a metal material including at least one of aluminum, copper, gold, or silver as a non-limiting example.

Second body region 28 of the second conductivity type containing impurities of the second conductivity type is provided in second region A2 of low-concentration impurity layer 33. Second source region 24 of the first conductivity type containing impurities of the first conductivity type is provided in second body region 28. In second region A2, a plurality of second gate trenches 27 that penetrate through second source region 24 and second body region 28 from the top surface of semiconductor layer 40 to a depth that reaches a portion of low-concentration impurity layer 33 are provided, and second gate conductor 25 is further provided on second gate insulating film 26 inside each of the plurality of second gate trenches 27.

Second source electrode 21 includes portion 22 and portion 23. Portion 22 is connected to second source region 24 and second body region 28 via portion 23. Second gate conductor 25 is an embedded gate electrode embedded inside semiconductor layer 40, and is electrically connected to second gate pad 129.

Portion 22 of second source electrode 21 is a layer joined with solder at the time of reflow in facedown mounting, and may comprise a metal material including at least one of nickel, titanium, tungsten, or palladium as a non-limiting example. The surface of portion 22 may be plated with gold etc.

Portion 23 of second source electrode 21 is a layer that connects portion 22 and semiconductor layer 40, and may comprise a metal material including at least one of aluminum, copper, gold, or silver as a non-limiting example.

The above-described configurations of transistors 10 and 20 allow semiconductor substrate 32 and an area of low-concentration impurity layer 33 in proximity to a location immediately above semiconductor substrate 32 to serve as a common drain region having a first drain region of transistor 10 and a second drain region of transistor 20 in common. Moreover, metal layer 41 serves as a common drain electrode (hereinafter also referred to as a back-surface-side drain electrode) disposed on the back surface side of semiconductor layer 40 and having a drain electrode of transistor 10 and a drain electrode of transistor 20 in common.

As shown in FIG. 1, first body region 18 is covered with interlayer insulating layer 34 having an opening, and portion 13 of first source electrode 11 is connected to first source region 14 via the opening of interlayer insulating layer 34. Interlayer insulating layer 34 and portion 13 of first source electrode 11 are covered with passivation layer 35 having an opening, and portion 12 is connected to portion 13 of first source electrode 11 via the opening of passivation layer 35.

Second body region 28 is covered with interlayer insulating layer 34 having an opening, and portion 23 of second source electrode 21 is connected to second source region 24 via the opening of interlayer insulating layer 34. Interlayer insulating layer 34 and portion 23 of second source electrode 21 are covered with passivation layer 35 having an opening, and portion 22 is connected to portion 23 of second source electrode 21 via the opening of passivation layer 35.

Accordingly, a plurality of first source pads 111 refer to a region in which first source electrode 11 is partially exposed to the surface of semiconductor device 1, that is, a terminal portion; and a plurality of second source pads 121 refer to a region in which second source electrode 21 is partially exposed to the surface of semiconductor device 1, that is, a terminal portion. Similarly, first gate pad 119 refers to a region in which first gate electrode 19 (not shown in FIG. 1 and FIG. 2A) is partially exposed to the surface of semiconductor device 1, that is, a terminal portion; and second gate pad 129 refers to a region in which second gate electrode 29 (not shown in FIG. 1 and FIG. 2A) is partially exposed to the surface of semiconductor device 1, that is, a terminal portion.

Figure 3A:
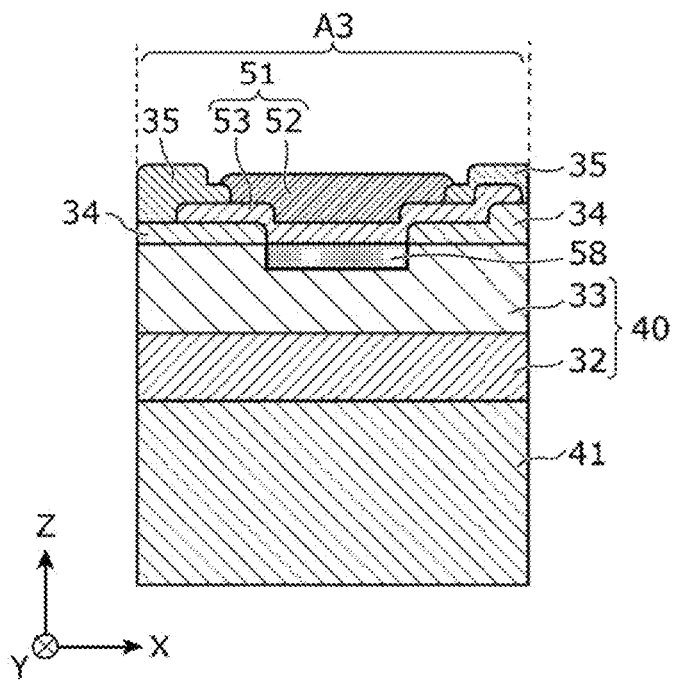
FIG. 3A is a cross-sectional view illustrating an example of a structure of the semiconductor device according to Embodiment 1.

FIG. 3A is a cross-sectional view taken along line II-II of FIG. 2A. As shown in FIG. 3A, in third region A3 of low-concentration impurity layer 33, drain lead-out region 58 of the first conductivity type containing impurities of the first conductivity type having a concentration higher than the concentration of the impurities of the first conductivity type contained in low-concentration impurity layer 33 is provided inside low-concentration impurity layer 33. It should be noted that drain lead-out region 58 may be provided to a depth that reaches semiconductor substrate 32, inside low-concentration impurity layer 33.

Drain electrode 51 (hereinafter also referred to as a front-surface-side drain electrode) includes portion 52 and portion 53. Portion 52 is connected to drain lead-out region 58 via portion 53.

Portion 52 of drain electrode 51 is a layer joined with solder at the time of reflow in facedown mounting, and may comprise a metal material including at least one of nickel, titanium, tungsten, or palladium as a non-limiting example. The surface of portion 52 may be plated with gold etc.

Portion 53 of drain electrode 51 is a layer that connects portion 52 and drain lead-out region 58. Accordingly, drain electrode 51 has a common drain potential of transistor 10 and transistor 20. Moreover, portion 53 of drain electrode 51 may comprise a metal material including at least one of aluminum, copper, gold, or silver as a non-limiting example.

As shown in FIG. 3A, low-concentration impurity layer 33 is covered with interlayer insulating layer 34 having an opening, and portion 53 of drain electrode 51 is connected to drain lead-out region 58 via the opening of interlayer insulating layer 34. Interlayer insulating layer 34 and portion 53 of drain electrode 51 are covered with passivation layer 35 having an opening, and portion 52 is connected to portion 53 of drain electrode 51 via the opening of passivation layer 35.

Accordingly, drain pad 151 refers to a region in which drain electrode 51 is partially exposed to the surface of semiconductor device 1, that is, a terminal portion.

According to a standard design example of each structure in semiconductor device 1, semiconductor layer 40 has a thickness of 10 to 90 μm, metal layer 41 has a thickness of 10 to 90 μm, and the sum of thicknesses of interlayer insulating layer 34 and passivation layer 35 is 3 to 13 μm.

As shown in FIG. 1 and FIG. 2A, transistor 10 includes, on a front surface of semiconductor layer 40, the plurality of first source pads 111 and first gate pad 119 that are joined to a mounting substrate via a bonding material at the time of facedown mounting. Moreover, transistor 20 includes, on the front surface of semiconductor layer 40, the plurality of second source pads 121 and second gate pad 129 that are joined to the mounting substrate via the bonding material at the time of facedown mounting. In addition, third region A3 includes, on the front surface of semiconductor layer 40, drain pad 151 joined to the mounting substrate via the bonding material at the time of facedown mounting.

As shown in FIG. 1 and FIG. 2A, semiconductor device 1 and semiconductor layer 40 are both in a rectangular shape in a plan view. It should be noted that although semiconductor device 1 and semiconductor layer 40 are both in the rectangular shape in FIG. 2A, semiconductor device 1 and semiconductor layer 40 may be both in a square shape.

Among directions parallel to the outer peripheral sides of semiconductor device 1 in the plan view, a direction in which first region A1 and second region A2 are arranged is defined as a first direction. First region A1 and second region A2 being arranged in the first direction in the plan view means that first region A1 and second region A2 face each other most in the first direction.

Facing each other most in the first direction means that border line 90C between first region A1 and second region A2 that is described later has a longest portion orthogonal to the first direction in the plan view. For example, when border line 90C is in a crank shape in the plan view, border line 90C is divided into constituent line segments, and a direction that is orthogonal to a direction in which the sum of line segments in the same direction is longest is defined as the first direction.

As shown in FIG. 2A, in a plan view of semiconductor layer 40, first region A1 and second region A2 are adjacent to each other, and are one region and an other region that divide an area of semiconductor layer 40 excluding third region A3 in half.

As shown in FIG. 2A, center line 90 is a line that divides semiconductor layer 40 in half in the first direction in the plan view of semiconductor layer 40. Center line 90 is a straight line in a direction orthogonal to the first direction in the plan view of semiconductor layer 40.

The center of third region A3 of semiconductor layer 40 is located on center line 90 of semiconductor layer 40 in the plan view of semiconductor layer 40. In FIG. 2A, a center refers to the center of a circular shape such as drain pad 151, to the point of intersection between the diagonal lines of a rectangular shape such as third region A3, and to the point of intersection between a long axis and a short axis of, for example, an elliptical shape.

Moreover, in FIG. 2A, a dashed line indicates virtual border line 90C that separates between first region A1, second region A2, and third region A3 of semiconductor layer 40. Border line 90C in a region in which first region A1 and second region A2 are adjacent to each other may be viewed as a virtual line that passes through the middle position of a space between portion 13 of first source electrode 11 and portion 23 of second source electrode 21. Additionally, border line 90C may be viewed as the space having a finite width (even though border line 90C is the space, it is possible to recognize the space as a line by the naked eye or external appearance at low magnification).

Border line 90C in a region in which first region A1 and third region A3 are adjacent to each other may be viewed as a virtual line that passes through the middle position of a space between portion 13 of first source electrode 11 and portion 53 of drain electrode 51. Additionally, border line 90C may be viewed as the space having a finite width.

Border line 90C in a region in which second region A2 and third region A3 are adjacent to each other may be viewed as a virtual line that passes through the middle position of a space between portion 23 of second source electrode 21 and portion 53 of drain electrode 51. Additionally, border line 90C may be viewed as the space having a finite width.

It should be noted that although border line 90C divides the area of semiconductor layer 40 excluding third region A3 in half in the plan view of semiconductor layer 40, border line 90C need not be a straight line. In addition, center line 90 and border line 90C may at least partially coincide with each other in the plan view of semiconductor layer 40.

Drain pad 151 is contained in third region A3 of semiconductor layer 40 in the plan view of semiconductor layer 40. In the example shown in FIG. 2A, the center of drain pad 151 and the center of third region A3 coincide with each other. Drain pad 151 need to be contained in third region A3, but the center of drain pad 151 and the center of third region A3 need not coincide with each other.

In the plan view of semiconductor layer 40, an area of third region A3 of semiconductor layer 40 may be smaller than an area of first region A1 and an area of second region A2. As will be described later, this is because the areas of first region A1 and second region A2 are required to be as large as possible to reduce conduction resistance of a primary pathway. In contrast, a secondary pathway in semiconductor device 1 may be capable of passing a relatively small current, and it is unnecessary to increase the area of third region A3. Typically, a shape of third region A3 in the plan view may be a rectangular shape that externally touches drain pad 151 contained in third region A3, except for a setup margin, regardless of a shape of drain pad 151.

Additionally, drain pad 151 is not necessarily limited to the shape exemplified in FIG. 2A, and may be in a substantially circular shape as exemplified in FIG. 2A or a substantially rectangular shape.

The number of the plurality of first source pads 111 of transistor 10 and the number of the plurality of second source pads 121 of transistor 20 are not necessarily limited to five exemplified in FIG. 2A, and may be a plural number other than five. Moreover, shapes of the plurality of first source pads 111 of transistor 10 and shapes of the plurality of second source pads 121 of transistor 20 are not necessarily limited to the substantially rectangular shapes exemplified in FIG. 2A, and may be the substantially rectangular shapes exemplified in FIG. 2A or substantially circular shapes. Furthermore, an arrangement of the plurality of first source pads 111 of transistor 10 and an arrangement of the plurality of second source pads 121 of transistor 20 are not necessarily limited to the arrangements exemplified in FIG. 2A.

The number of first gate pads 119 of transistor 10 and the number of second gate pads 129 of transistor 20 are not necessarily limited to one exemplified in FIG. 2A, and may be a plural number greater than or equal to two. Moreover, a shape of first gate pad 119 and a shape of second gate pad 129 may or may not be a substantially circular shape as exemplified in FIG. 2A. Furthermore, an arrangement of first gate pad 119 and an arrangement of second gate pad 129 are not necessarily limited to the arrangements exemplified in FIG. 2A.

Although not shown in FIG. 1 and FIG. 2A, in the plan view of semiconductor layer 40, a first equipotential ring (EQR) that is electrically connected to a drain region of transistor 10 may be disposed on an outer peripheral side of first region A1. Similarly, in the plan view of semiconductor layer 40, a second EQR that is electrically connected to a drain region of transistor 20 may be disposed on an outer peripheral side of second region A2. The first EQR and the second EQR may be shared in a portion in which transistor 10 and transistor 20 are adjacent to and face each other.

The first EQR is disposed in transistor 10 in expectation of a function to impede a leak current from flowing between an outside and first body region 18. Moreover, the second EQR is disposed in transistor 20 in expectation of a function to impede a leak current from flowing between the outside and second body region 28.

The first EQR and the second EQR may each comprise, as a non-limiting example, a metal material including at least one of aluminum, copper, gold, or silver. Moreover, the first EQR and the second EQR may be electrically connected to front-surface-side drain electrode 51, or may be electrically connected to back-surface-side drain electrode 41 via semiconductor substrate 32 that is the common drain region.

[2. Operation of Semiconductor Device]

Figure 4A:
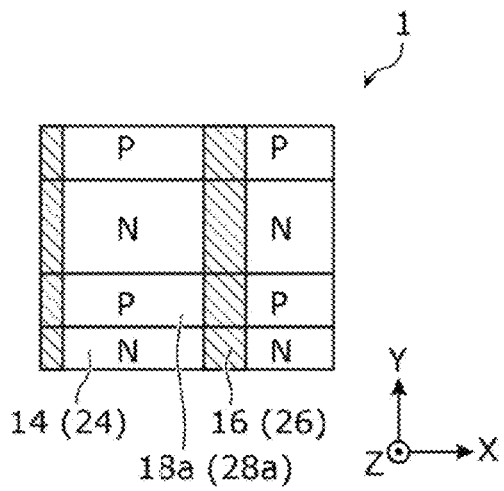
FIG. 4A is a plan view of an approximate single unit configuration of a first transistor according to Embodiment 1.
Figure 4B:
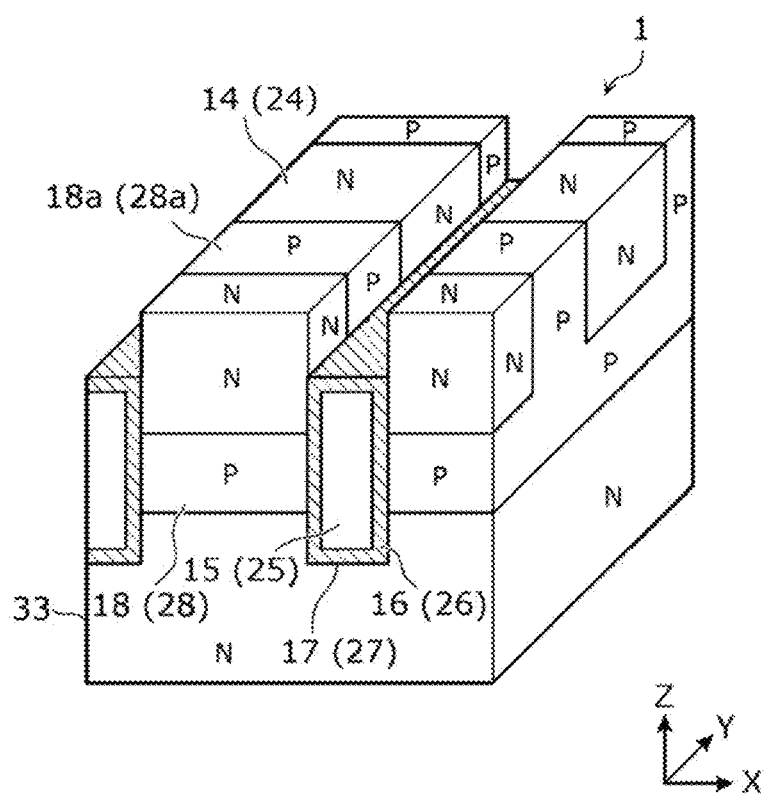
FIG. 4B is a perspective view of the approximate single unit configuration of the first transistor according to Embodiment 1.

FIG. 4A and FIG. 4B are a plan view and a perspective view of an approximate single unit configuration of transistor 10 or transistor 20 that is repeatedly formed in an X direction and a Y direction of semiconductor device 1, respectively. For the sake of clarity, neither FIG. 4A nor FIG. 4B illustrates semiconductor substrate 32, metal layer 41, passivation layer 35, first source electrode 11 or second source electrode 21, and interlayer insulating layer 34.

The Y direction is a direction that is parallel to the top surface of semiconductor layer 40 and in which first gate trench 17 extends. The X direction is a direction that is parallel to the top surface of semiconductor layer 40 and orthogonal to the Y direction. A Z direction is a direction that is orthogonal to both the X direction and the Y direction and indicates a height direction of semiconductor device 1.

In the following description, although directions are described according to the definitions above, the Y direction and the X direction may be interchanged. In other words, the X direction may be the direction that is parallel to the top surface of semiconductor layer 40 and in which first gate trench 17 extends. In this case, the Y direction is a direction that is parallel to the top surface of semiconductor layer 40 and orthogonal to the X direction.

As shown in FIG. 4A and FIG. 4B, transistor 10 includes first connector 18a that electrically connects first body region 18 and first source electrode 11. First connector 18a is a region of first body region 18 in which first source region 14 is not provided, and contains the same impurities of the second conductivity type as those of first body region 18. First source region 14 and first connector 18a are alternately and periodically disposed in the Y direction. The same applies to transistor 20.

In semiconductor device 1, for example, assuming that the first conductivity type is N-type and the second conductivity type is P-type, first source region 14, second source region 24, drain lead-out region 58, semiconductor substrate 32, and low-concentration impurity layer 33 may be N-type semiconductors, and first body region 18, first connector 18a, second body region 28, and second connector 28a may be P-type semiconductors.

Moreover, in semiconductor device 1, for example, assuming that the first conductivity type is P-type and the second conductivity type is N-type, first source region 14, second source region 24, drain lead-out region 58, semiconductor substrate 32, and low-concentration impurity layer 33 may be P-type semiconductors, and first body region 18, first connector 18a, second body region 28, and second connector 28a may be N-type semiconductors.

Figure 2B:
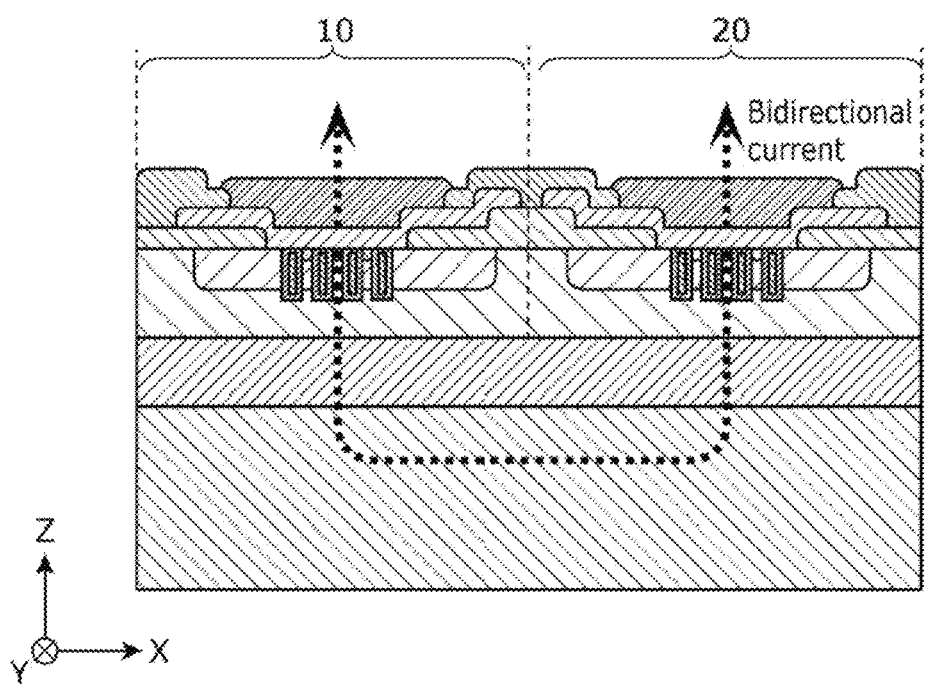
FIG. 2B is a cross-sectional view illustrating a principal current flowing through the semiconductor device according to Embodiment 1.

The following description illustrates a bidirectional conducting pathway in which a principal current of semiconductor device 1 shown in FIG. 2B flows, when, assuming that the first conductivity type is N-type and the second conductivity is P-type, transistors 10 and 20 are what is called N-channel transistors.

In semiconductor device 1, when a high voltage and a low voltage are applied to first source electrode 11 and second source electrode 21, respectively, and a voltage higher than or equal to a threshold value with reference to second source electrode 21 is applied to second gate electrode 29 (second gate conductor 25), a conducting channel is formed in the vicinity of second gate insulating film 26 in second body region 28. As a result, a principal current flows in a pathway from first source electrode 11 to first connector 18a to first body region 18 to low-concentration impurity layer 33 to semiconductor substrate 32 to metal layer 41 to semiconductor substrate 32 to low-concentration impurity layer 33 to the conducting channel formed in second body region 28 to second source region 24 to second source electrode 21, and semiconductor device 1 becomes conductive. This conducting pathway is referred to as a primary pathway in the present disclosure. A contact surface between first body region 18 and low-concentration impurity layer 33 in the primary pathway is a PN junction and serves as a body diode.

In semiconductor device 1, when a high voltage and a low voltage are applied to second source electrode 21 and first source electrode 11, respectively, and a voltage higher than or equal to a threshold value with reference to first source electrode 11 is applied to first gate electrode 19 (first gate conductor 15), a conducting channel is formed in the vicinity of first gate insulating film 16 in first body region 18. As a result, a principal current flows in a pathway from second source electrode 21 to second connector 28a to second body region 28 to low-concentration impurity layer 33 to semiconductor substrate 32 to metal layer 41 to semiconductor substrate 32 to low-concentration impurity layer 33 to the conducting channel formed in first body region 18 to first source region 14 to first source electrode 11, and semiconductor device 1 becomes conductive. This conducting pathway is also referred to as the primary pathway in the present disclosure. A contact surface between second body region 28 and low-concentration impurity layer 33 in the primary pathway is a PN junction and serves as a body diode.

Furthermore, in semiconductor device 1, a conducting channel may be formed in the vicinity of first gate insulating film 16 in first body region 18 by applying a voltage higher than or equal to a threshold value to first gate electrode 19; and at the same time, a conducting channel may be formed in the vicinity of second gate insulating film 26 in second body region 28 by applying a voltage higher than or equal to the threshold value to second gate electrode 29. As a result, a principal current may flow in a pathway from first source electrode 11 to first source region 14 to the conducting channel formed in first body region 18 to low-concentration impurity layer 33 to semiconductor substrate 32 to metal layer 41 to semiconductor substrate 32 to low-concentration impurity layer 33 to the conducting channel formed in second body region 28 to second source region 24 to second source electrode 21, or a principal current may flow in a reverse pathway, and semiconductor device 1 may become conductive. This bidirectional conducting pathway is also referred to as the primary pathway in the present disclosure.

It should be noted that the principal current and the primary pathway in the present disclosure are convenient designations to distinguish them from a secondary current and a secondary pathway to be described later.

Figure 3B:
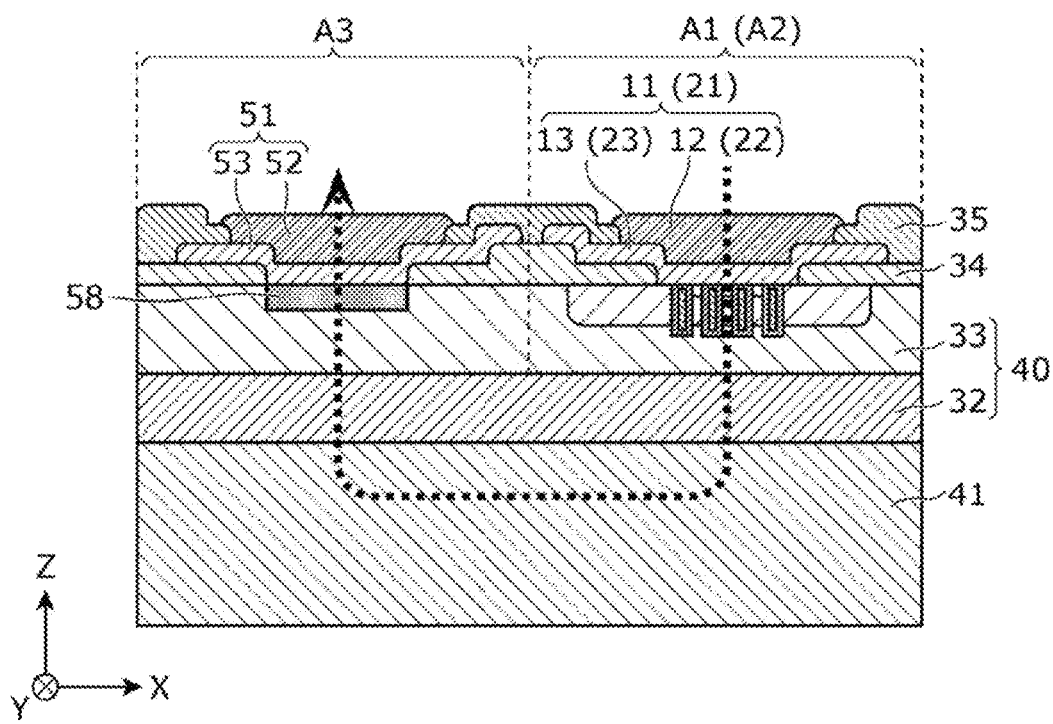
FIG. 3B is a cross-sectional view illustrating a secondary current flowing through the semiconductor device according to Embodiment 1.

FIG. 3B is a cross-sectional view illustrating a secondary current flowing through semiconductor device 1. A secondary current refers to a current the conduction of which is controlled by an external switching element (e.g., a vertical MOS transistor of a single type) that is not shown in FIG. 3B and is connected in series with drain electrode 51 of semiconductor device 1, and is a relatively small current compared to the principal current. It should be noted that a conducting pathway in which the secondary current flows in semiconductor device 1 is referred to as the secondary pathway in the present disclosure.

In semiconductor device 1, when a high voltage and a low voltage are applied to first source electrode 11 and drain electrode 51, respectively, and the external switching element connected in series with drain electrode 51 becomes conductive, the secondary current flows in a pathway from first source electrode 11 to first connector 18a to first body region 18 to low-concentration impurity layer 33 to semiconductor substrate 32 to metal layer 41 to semiconductor substrate 32 to low-concentration impurity layer 33 to drain lead-out region 58 to drain electrode 51, and semiconductor device 1 becomes conductive. It should be noted that when a high voltage and a low voltage are applied to first source electrode 11 and drain electrode 51, respectively, the external switching element becomes conductive, and a voltage higher than or equal to a threshold value with reference to first source electrode 11 is applied to first gate electrode 19, a conducting channel is formed in the vicinity of first gate insulating film 16 in first body region 18, the secondary current flows in a pathway from first source electrode 11 to first source region 14 to the conducting channel formed in first body region 18 to low-concentration impurity layer 33 to semiconductor substrate 32 to metal layer 41 to semiconductor substrate 32 to low-concentration impurity layer 33 to drain lead-out region 58 to drain electrode 51, and semiconductor device 1 becomes conductive.

When a high voltage and a low voltage are applied to second source electrode 21 and drain electrode 51, respectively, and the external switching element connected in series with drain electrode 51 becomes conductive, the secondary current flows in a pathway from second source electrode 21 to second connector 28a to second body region 28 to low-concentration impurity layer 33 to semiconductor substrate 32 to metal layer 41 to semiconductor substrate 32 to low-concentration impurity layer 33 to drain lead-out region 58 to drain electrode 51, and semiconductor device 1 becomes conductive. It should be noted that when a high voltage and a low voltage are applied to second source electrode 21 and drain electrode 51, respectively, the external switching element becomes conductive, and a voltage higher than or equal to a threshold value with reference to second source electrode 21 is applied to second gate electrode 29, a conducting channel is formed in the vicinity of second gate insulating film 26 in second body region 28, the secondary current flows in a pathway from second source electrode 21 to second source region 24 to the conducting channel formed in second body region 28 to low-concentration impurity layer 33 to semiconductor substrate 32 to metal layer 41 to semiconductor substrate 32 to low-concentration impurity layer 33 to drain lead-out region 58 to drain electrode 51, and semiconductor device 1 becomes conductive.

Those conducting pathways in which the secondary current flows are secondary pathways. A secondary pathway in semiconductor device 1 is controlled by causing the external switching element connected in series with drain electrode 51 to be conductive or non-conductive. When the switching element is conductive, the secondary pathway in semiconductor device 1 becomes conductive. It should be noted that a contact surface between first body region 18 and low-concentration impurity layer 33 and a contact surface between second body region 28 and low-concentration impurity layer 33 in the secondary pathway are each a PN junction and each serve as a body diode.

When the primary pathway becomes conductive, since it is necessary to cause the external switching element connected in series with drain electrode 51 to be non-conductive, the secondary pathway becomes non-conductive, and only the primary pathway becomes conductive.

Figure 2C:
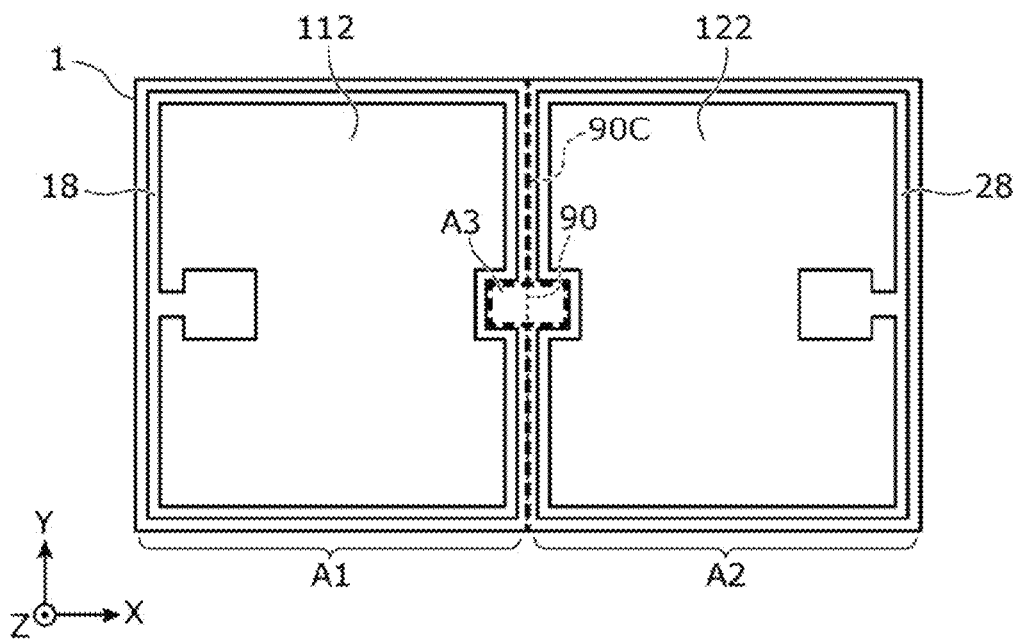
FIG. 2C is a plan view illustrating an example of shapes of body regions and active regions of the semiconductor device according to Embodiment 1.

FIG. 2C is a plan view illustrating an example of shapes of, among the constituent elements of semiconductor device 1, first body region 18, second body region 28, first active region 112, and second active region 122 in the plan view of semiconductor layer 40. For the sake of clarity of a top surface structure of semiconductor layer 40 that cannot be actually viewed, passivation layer 35, first source electrode 11, first gate electrode 19, second source electrode 21, second gate electrode 29, drain electrode 51, and interlayer insulating layer 34 are omitted from FIG. 2C as if they are transparent. In addition, first source region 14, second source region 24, and drain lead-out region 58 are also omitted from the figure.

In order to reduce conduction resistance of the primary pathway in semiconductor device 1, it is necessary to cause first active region 112 and second active region 122 to be as broad as possible. First active region 112 refers to a minimum area that contains an entire portion in which a conducting channel is formed when a voltage higher than or equal to a threshold value is applied to first gate electrode 19 (first gate conductor 15) of transistor 10. The portion in which the conducting channel is formed is a portion in which each of the plurality of first gate trenches 17 is adjacent to first source region 14. As shown in FIG. 2C, first active region 112 is contained in first body region 18 in the plan view of semiconductor layer 40. Second active region 122 refers to a minimum area that contains an entire portion in which a conducting channel is formed when a voltage higher than or equal to a threshold value is applied to second gate electrode 29 (second gate conductor 25) of transistor 20. The portion in which the conducting channel is formed is a portion in which each of the plurality of second gate trenches 27 is adjacent to second source region 24. As shown in FIG. 2C, second active region 122 is contained in second body region 28 in the plan view of semiconductor layer 40.

Since the primary pathway expands when an area of first active region 112 and an area of second active region 122 are large, the conduction resistance of the primary pathway in semiconductor device 1 is reduced.

Figure 2D:
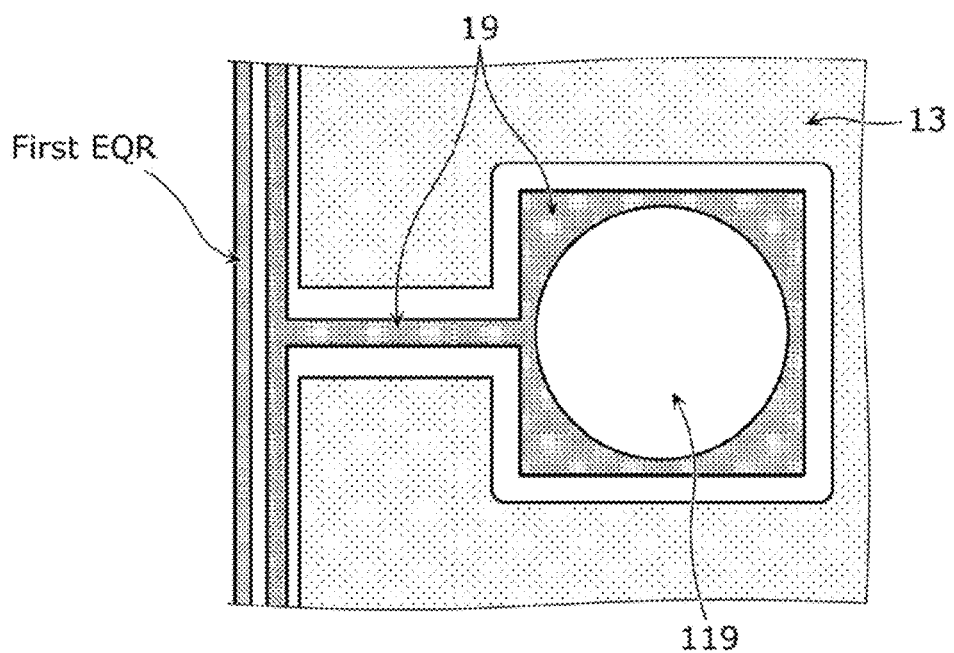
FIG. 2D is a plan view illustrating an example of an enlarged gate electrode portion of the semiconductor device according to Embodiment 1.

FIG. 2D is a plan view obtained by enlarging a portion in which first gate pad 119 shown in FIG. 2A is disposed. FIG. 2D is an example of shapes of, among the constituent elements of semiconductor device 1, portion 13 of first source electrode 11, first gate electrode 19, and first gate pad 119 in the plan view of semiconductor layer 40. For the sake of clarity of the top surface structure of semiconductor layer 40 that cannot be actually viewed, passivation layer 35 and interlayer insulating layer 34 are omitted from FIG. 2D as if they are transparent. In addition, first source region 14 is also omitted from the figure.

Although not shown in the figure, portion 23 of second source electrode 21, second gate electrode 29, and second gate pad 129 are each in a shape that is line-symmetrical to a corresponding one of portion 13 of first source electrode 11, first gate electrode 19, or first gate pad 119 shown in FIG. 2D with reference to center line 90 as a symmetrical axis.

A region immediately below first gate electrode 19 and a proximate region of the region, and a region immediately below second gate electrode 29 and a proximate region of the region, are regions that do not contribute to conduction of the primary pathway. Here, the proximate regions are regions along the outer peripheries of first gate electrode 19 and second gate electrode 29, and may be considered as a region between first gate electrode 19 and portion 13 of first source electrode 11 shown in FIG. 2D and a region between second gate electrode 29 and portion 23 of second source electrode 21 not shown in the figure.

Similarly, third region A3 containing drain pad 151 is also a region that does not contribute to the conduction of the primary pathway.

To put it another way, in semiconductor device 1, although the region immediately below first gate electrode 19 and the proximate region, the region immediately below second gate electrode 29 and the proximate region, and third region A3 are regions necessary for semiconductor device 1 to function, they are regions the reduction of which is desired as much as possible in a limited device area to reduce the conduction resistance of the primary pathway in semiconductor device 1.

[3. Application Example of Semiconductor Device]

Figure 5A:
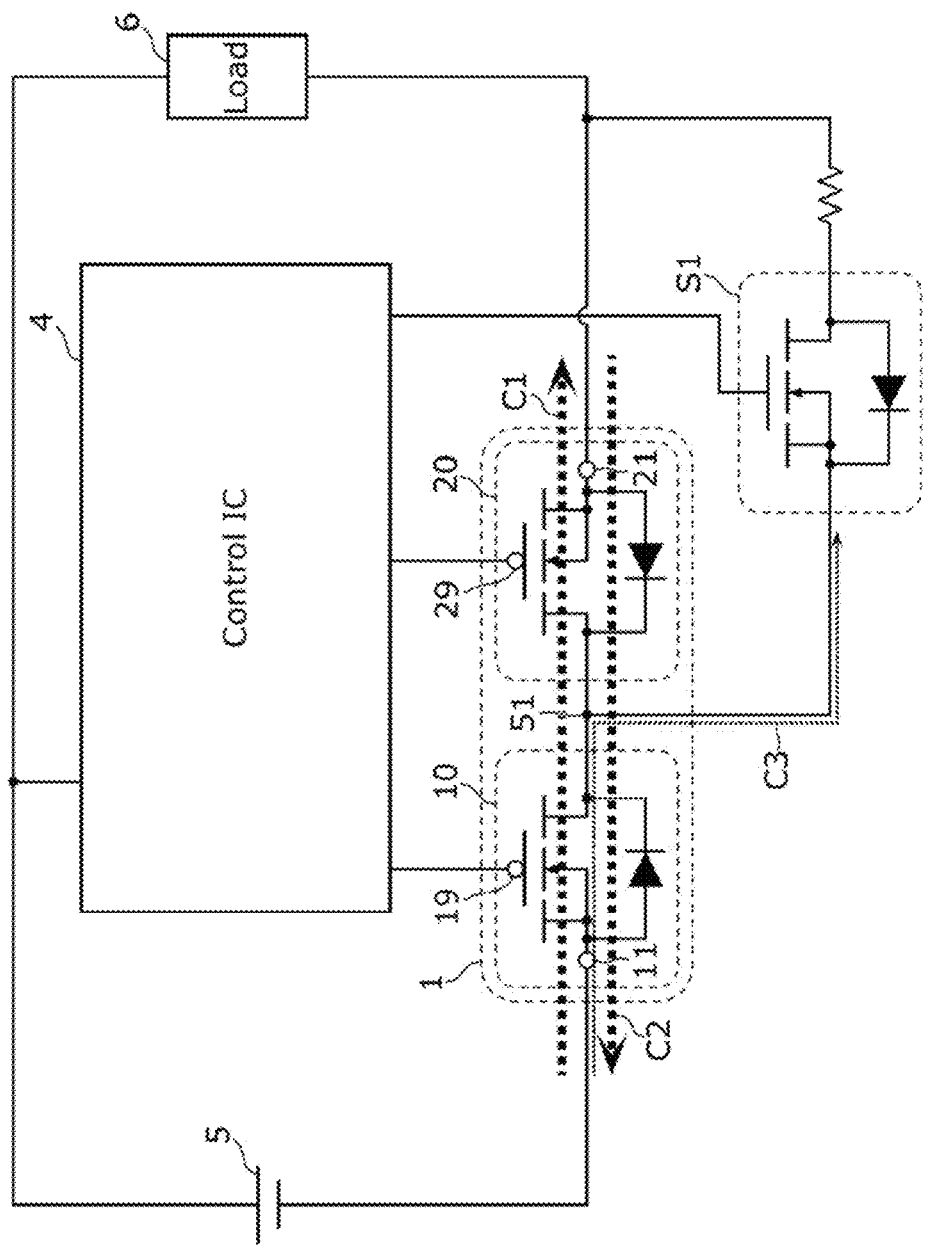
FIG. 5A is a circuit diagram illustrating an example of application to a charging and discharging circuit of the semiconductor device according to Embodiment 1.

FIG. 5A is a circuit diagram illustrating an application example in which semiconductor device 1 according to the present disclosure is applied to a protection circuit of lithium-ion battery 5. In this application example, semiconductor device 1 controls bidirectional conduction that is a primary pathway in response to a control signal sent from control IC4 to first gate electrode 19 and second gate electrode 29, and controls a discharging operation from lithium-ion battery 5 to load 6 or a charging operation from load 6 to lithium-ion battery 5. At this time, since charging current C1 or discharging current C2 that flows through semiconductor device 1 is a relatively large current, a secondary pathway is not used. When semiconductor device 1 according to the present disclosure is applied to a battery protection circuit, controlling bidirectional conduction of charging and discharging using the primary pathway is a main function of semiconductor device 1 in a manner. Since the primary pathway passes a relatively large current, the primary pathway may reduce conduction resistance as much as possible.

The use of the secondary pathway is next described with reference to FIG. 5A. Semiconductor device 1 includes the secondary pathway in which drain electrode 51 is used, in addition to the primary pathway. Charging current C3 flows in the secondary pathway at the time of precharging. When a voltage of lithium-ion battery 5 is in a state of overdischarge, it is dangerous to perform a charging operation using relatively large charging current C1 that is the same as a current used in normal charging. The precharging refers to performing a charging operation using relatively small charging current C3.

In FIG. 5A, since semiconductor device 1 alone is not capable of controlling conduction of the secondary pathway, external switching element S1 (e.g., the vertical MOS transistor of the single type) that is capable of controlling a conducting state and a non-conducting state is connected in series with drain electrode 51 of semiconductor device 1. The conducting state and the non-conducting state of external switching element S1 are controlled by a control signal sent from control IC4. External switching element S1 controls a charging operation from load 6 to lithium-ion battery 5 using relatively small charging current C3, by (i) causing the secondary pathway of semiconductor device 1 to be in the conducting state when switching element S1 is in the conducting state and (ii) causing the secondary pathway of semiconductor device 1 to be in the non-conducting state when switching element S1 is in the non-conducting state. It should be noted that when the primary pathway of semiconductor device 1 is conducted, it is necessary for external switching element S1 to always be controlled in the non-conducting state.

In the precharging, charging is started using relatively small charging current C3, and is switched to a charging operation using relatively large charging current C1 after lithium-ion battery 5 is charged to a certain level. Since the secondary pathway is required to only pass relatively small charging current C3, a reduction of conduction resistance in the secondary pathway is not emphasized.

Figure 5B:
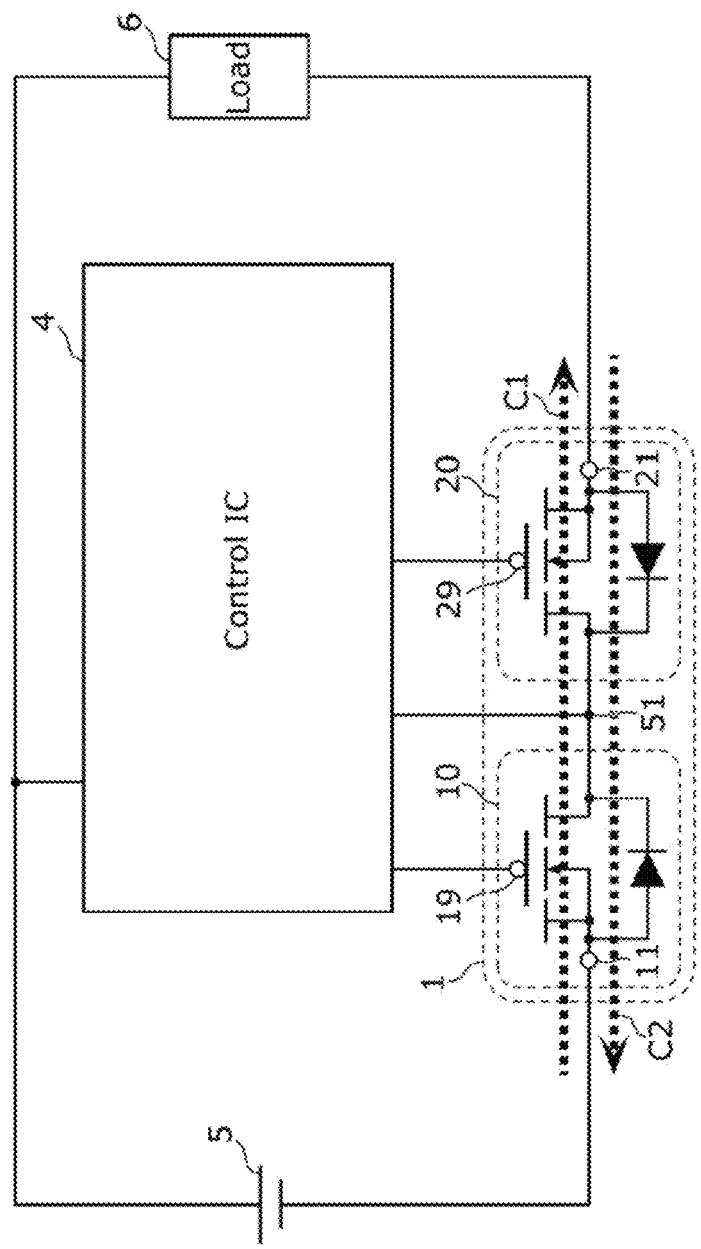
FIG. 5B is a circuit diagram illustrating an example of application to the charging and discharging circuit of the semiconductor device according to Embodiment 1.

FIG. 5B is an application example of semiconductor device 1, and is a circuit diagram illustrating an application example in which semiconductor device 1 is applied to a protection circuit of lithium-ion battery 5 used in a lithium-ion battery pack, as with FIG. 5A. Also in FIG. 5B, a main function of semiconductor device 1 is the same as that illustrated in FIG. 5A, that is, controlling charging current C1 and discharging current C2. On the other hand, FIG. 5B differs from FIG. 5A in the use of a secondary pathway. Drain electrode 51 of semiconductor device 1 is connected to control IC4, and is used as a monitor terminal for a drain voltage common to transistor 10 and transistor 20. In FIG. 5B, since the secondary pathway of semiconductor device 1 is connected to control IC4 and caused to be in the non-conducting state by control IC4, a secondary current does not flow in the secondary pathway. When control IC4 controls charging current C1 and discharging current C2 of lithium-ion battery 5, control IC4 monitors a voltage of drain electrode 51 using the secondary pathway. When the voltage of drain electrode 51 deviates from a normal voltage range of lithium-ion battery 5, control IC4 determines that lithium-ion battery 5 is in an abnormal state, and suspends a charging and discharging operation. This makes it possible to prevent lithium-ion battery 5 from being overdischarged and overcharged.

[4. Advantageous Effects of Semiconductor Device 1 According to Embodiment 1]

Above-described semiconductor device 1 in the present disclosure has the following characteristics.

Semiconductor device 1 according to one aspect of the present disclosure is facedown mountable, chip-size-package type semiconductor device 1, semiconductor device 1 including: semiconductor substrate 32; low-concentration impurity layer 33 that is provided on semiconductor substrate 32; first vertical MOS transistor 10 that is provided in first region A1 of semiconductor layer 40 that is a combination of semiconductor substrate 32 and low-concentration impurity layer 33; second vertical MOS transistor 20 that is provided in second region A2 adjacent to first region A1 in a plan view of semiconductor layer 40; a plurality of first source pads 111 that are provided in first region A1 in the plan view and connected to first source electrode 11 of first vertical MOS transistor 10; first gate pad 119 that is provided in first region A1 in the plan view and connected to first gate electrode 19 of first vertical MOS transistor 10; a plurality of second source pads 121 that are provided in second region A2 in the plan view and connected to second source electrode 21 of second vertical MOS transistor 20; second gate pad 129 that is provided in second region A2 in the plan view and connected to second gate electrode 29 of second vertical MOS transistor 20; and metal layer 41 that is provided in contact with a back surface of semiconductor substrate 32. Semiconductor substrate 32 is a common drain region for first vertical MOS transistor 10 and second vertical MOS transistor 20. In the plan view, semiconductor layer 40 is in a rectangular shape. In the plan view, first vertical MOS transistor 10 and second vertical MOS transistor 20 are arranged in a first direction. In the plan view, semiconductor layer 40 includes third region A3 that does not overlap first region A1 and second region A2. In the plan view, first region A1 and second region A2 are one region and an other region that divide an area of a region of semiconductor layer 40 excluding third region A3 in half. In the plan view, a center of third region A3 is located on center line 90 that is straight and orthogonal to the first direction and divides semiconductor layer 40 in half in the first direction. In the plan view, semiconductor layer 40 includes one drain pad 151 that is connected to the common drain region. In the plan view, drain pad 151 is contained in third region A3.

According to the above-described configuration, providing only one drain pad 151 that is a minimum necessary number for configuring a secondary pathway makes it possible to reduce an area of third region A3 compared to a case in which a plurality of drain pads are provided, and providing the secondary pathway makes it possible to inhibit an increase in conduction resistance in a primary pathway as much as possible.

Moreover, in a plan view of semiconductor layer 40, it is possible to dispose third region A3 of semiconductor layer 40 on center line 90 of semiconductor layer 40, and use to a certain degree a region that does not originally contribute to conduction of the primary pathway as a region in which drain pad 151 is disposed. For this reason, it is possible to inhibit an increase in conduction resistance of the primary pathway compared to a case in which third region A3 is disposed in a location other than center line 90 in the plan view of semiconductor layer 40.

Furthermore, since the center of third region A3 is located on center line 90 of semiconductor layer 40 in the plan view of semiconductor layer 40, even though third region A3 (drain pad 151) is disposed, it is difficult to prevent first active region 112 and second active region 122 from becoming identical in area and shape. Accordingly, a lack of balance in electrical characteristics of the bidirectional conduction and heat dissipation property between transistor 10 and transistor 20 is less likely to occur.

Since the principal current of semiconductor device 1 flows bidirectionally, as with the above-described configuration, transistor 10 and transistor 20 may include pad arrangements that are line-symmetrical with reference to border line 90C as a symmetrical axis or point-symmetrical with reference to the center of semiconductor layer 40 as a point of symmetry. At this time, a lack of balance in electrical characteristics and heat dissipation property due to a difference in principal current direction is less likely to occur. For example, when a protection circuit that uses semiconductor device 1 is included in a lithium-ion battery pack of a smartphone or a tablet etc., either in charging or in discharging, it is unnecessary to make any special difference with regard to a conducting direction in semiconductor device 1

Figure 6A:
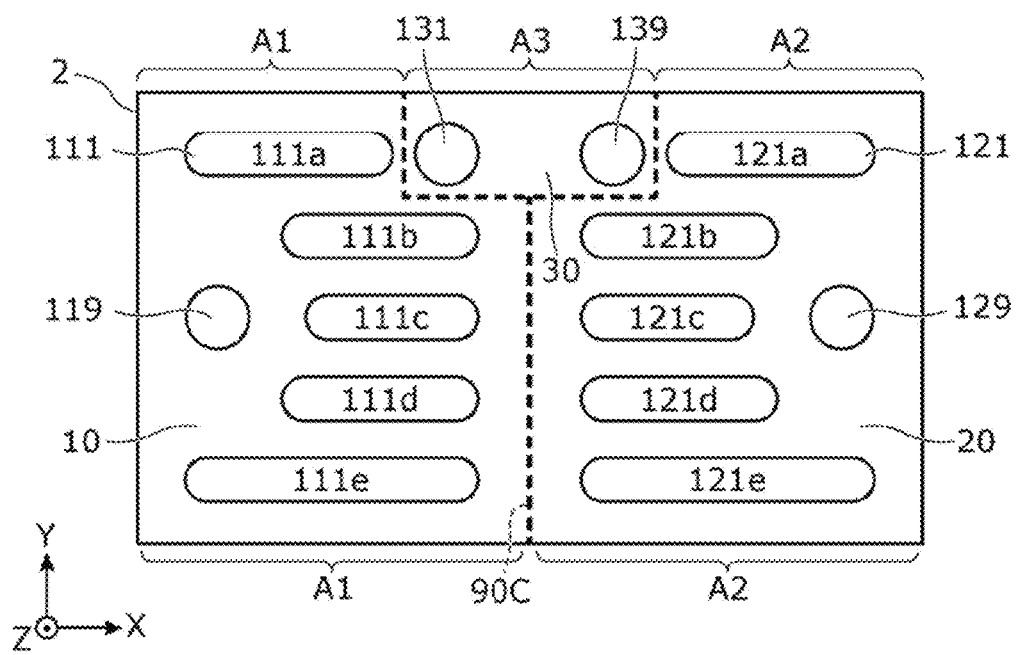
FIG. 6A is a plan view illustrating an example of an arrangement of pads in a comparative example of the semiconductor device according to Embodiment 1.

Semiconductor device 2 according to a comparative example of Embodiment 1 is described with reference to FIG. 6A and FIG. 6B. Constituent elements of semiconductor device 2 according to the comparative example that are similar to those of semiconductor device 1 are assigned the same reference signs, and the detailed description thereof is omitted, because they have already been described.

In semiconductor device 2, third region A3 in the plan view of semiconductor layer 40 includes third vertical MOS transistor 30 (hereinafter also referred to as transistor 30). Accordingly, semiconductor device 2 is semiconductor device 2 including a triple configuration in which three vertical MOS transistors (transistor 10, transistor 20, transistor 30) each having a separate control function are provided inside one device.

Transistor 30 has a configuration similar to that of transistor 10 or transistor 20. Semiconductor device 2 does not include drain pad 151 and drain lead-out region 58 included in semiconductor device 1 according to Embodiment 1.

Transistor 30 includes third source pad 131 and third gate pad 139 in the surface (third region A3) of semiconductor layer 40. A drain region of transistor 30 is commonized along with the drain regions of transistor 10 and transistor 20.

Figure 6B:
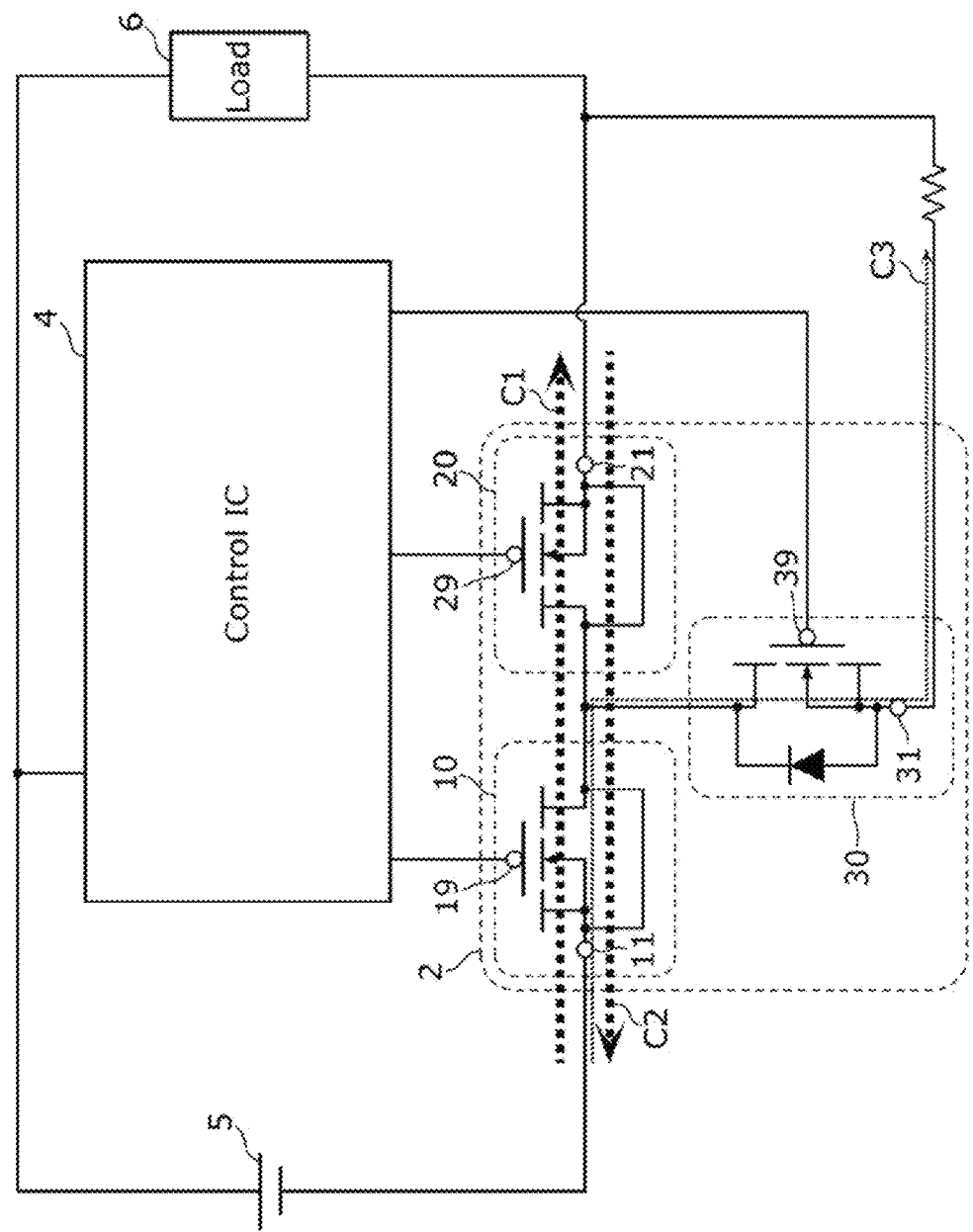
FIG. 6B is a circuit diagram illustrating an example of application to a charging and discharging circuit in the comparative example of the semiconductor device according to Embodiment 1.

FIG. 6B is a circuit diagram illustrating an application example in which semiconductor device 2 according to the comparative example is applied to the same protection circuit of lithium-ion battery 5 as illustrated in FIG. 5A. A main function of semiconductor device 2 in FIG. 6B is the same as that of semiconductor device 1 according to Embodiment 1 (FIG. 5A). On the other hand, a secondary pathway of semiconductor device 2 according to the comparative example is a pathway from first source electrode 11 of transistor 10 through the inside of semiconductor device 2 to third source electrode 31 of transistor 30. Alternatively, the secondary pathway is a pathway from second source electrode 21 of transistor 20 through the inside of semiconductor device 2 to third source electrode 31 of transistor 30.

In FIG. 6B, conduction of the secondary pathway of semiconductor device 2 is controlled by a control signal sent from control IC4 to third gate electrode 39 of transistor 30. In other words, semiconductor device 2 according to the comparative example has a function of controlling the conduction of the secondary pathway. For this reason, external switching element S1 that is necessary in Embodiment 1 (FIG. 5A) is unnecessary.

A comparison between the secondary pathway in semiconductor device 1 according to Embodiment 1 and the secondary pathway in semiconductor device 2 according to the comparative example shows that semiconductor device 1 according to Embodiment 1 makes it possible to reduce an area of semiconductor device 1 as much as semiconductor device 1 does not have the control function in the secondary pathway. Alternatively, since it is possible to increase an area used as the primary pathway as much as the reduction, it is possible to reduce conduction resistance of the primary pathway.

FIG. 7A to FIG. 7D, FIG. 8A to FIG. 8D, FIG. 9A, FIG. 9B, and FIG. 10A to FIG. 10C are each a plan view illustrating an example of an arrangement of pads that satisfies conditions for semiconductor device 1 according to Embodiment 1.

As shown in FIG. 7A to FIG. 7D, the center of third region A3 may be located on center line 90 of semiconductor layer 40 in the plan view of semiconductor layer 40, first region A1 and second region A2 need not be disposed between third region A3 and an outer peripheral side of semiconductor layer 40 that is closest to third region A3 and parallel to the first direction, and drain pad 151 may be contained in third region A3.

According to the above-described configuration, in the plan view of semiconductor layer 40, it is possible to dispose drain pad 151 as close as possible to an outer peripheral side of semiconductor layer 40. For this reason, it is possible to reduce the possibility of a solder joint defect occurring due to warpage occurring in semiconductor device 1, compared to a case in which drain pad 151 is disposed at the center of semiconductor layer 40.

The following describes warpage of semiconductor layer 1. Thinning semiconductor layer 40 (mainly semiconductor substrate 32) that is a resistance component for the principal current that flows in the vertical direction in FIG. 2B is effective as a means to reduce conduction resistance of semiconductor device 1. Moreover, thickening metal layer 41 is also useful in reducing the conduction resistance. In other words, thinning semiconductor layer 40 and thickening metal layer 41 are effective in reducing the conduction resistance in semiconductor device 1. However, when semiconductor layer 40 and metal layer 41 become similar in thickness, warpage that occurs in semiconductor device 1 increases at high temperatures due to a difference in physical property value, such as a thermal expansion coefficient or a Young's modulus, between a semiconductor and a metal.

Warpage that occurs in semiconductor device 1 mainly occurs in a high-temperature environment when heat treatment is performed at approximately 250 degrees Celsius at the time of reflow in facedown mounting. In the facedown mounting, since metal layer 41 expands more than semiconductor layer 40 at high temperatures, warpage that protrudes in a direction away from the mounting substrate occurs.

Figure 11:
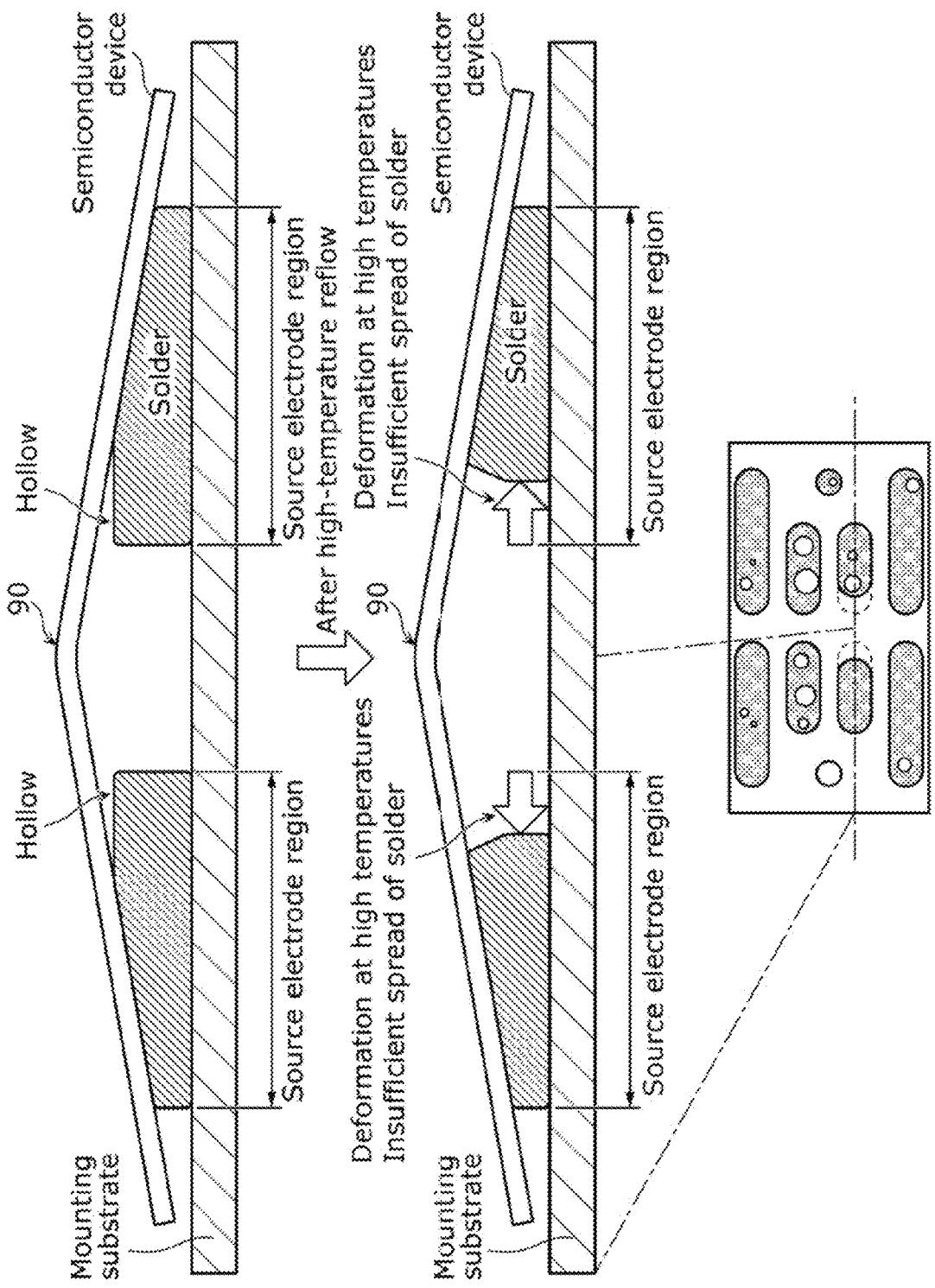
FIG. 11 is a cross-sectional view illustrating a state in which the semiconductor device according to Embodiment 1 warps.

As shown in FIG. 11, warpage of semiconductor device 1 causes inconvenience when semiconductor device 1 is mounted. A deficiency of solder in the vicinity of the center of semiconductor device 1 that corresponds to the protruding portion can cause a joint defect (insufficient spread of solder). In contrast, since force for pushing in a mounting substrate direction increases in an outer peripheral region of semiconductor device 1 due to the warpage, a phenomenon (solder protrusion) in which solder protrudes from a region in which the solder should be originally contained is found.

When semiconductor layer 40 is in a rectangular shape, although warpage that occurs in semiconductor device 1 curves semiconductor layer 40 most significantly in a direction parallel to a longer side of semiconductor layer 40, the warpage also curves semiconductor layer 40 slightly in a direction parallel to a shorter side of semiconductor layer 40.

The warpage of semiconductor device 1 that occurs at high temperatures in reflow soldering is warpage that occurs in a central portion of semiconductor 40 and protrudes in the direction away from the mounting substrate. Although a deficiency of solder in the vicinity of the center of semiconductor device 1 that corresponds to the protruding portion can cause a joint defect, since drain pad 151 is disposed in an outer peripheral portion of semiconductor layer 40 by causing semiconductor device 1 to be configured as shown in each of FIG. 7A to FIG. 7D, it is possible to reduce the possibility of a solder joint defect occurring due to the warpage of semiconductor device 1, compared to a case in which drain pad 151 is disposed in the central portion of semiconductor layer 40.

Figure 7A:
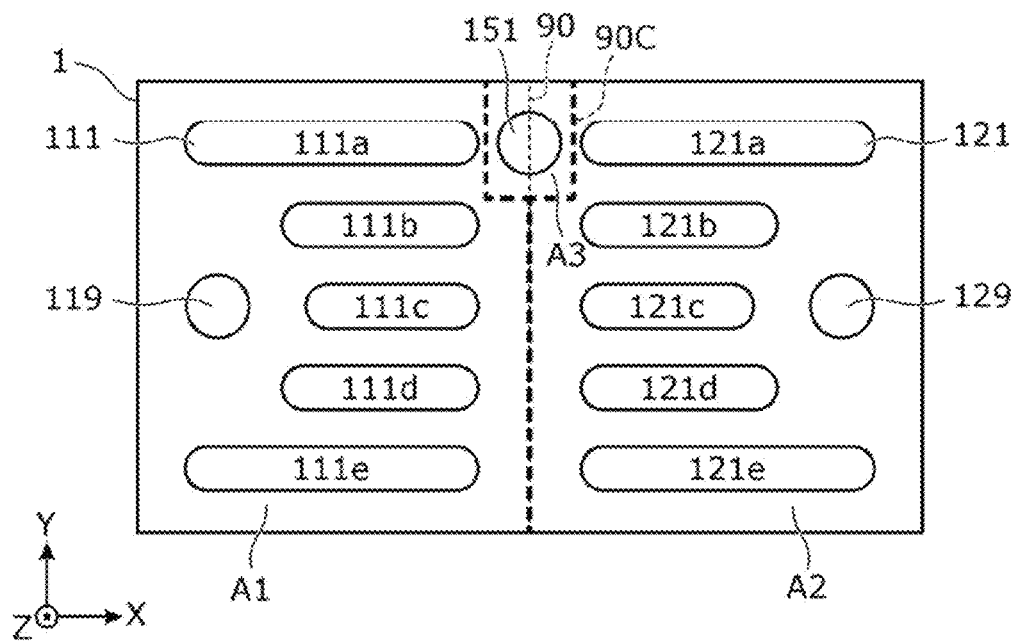
FIG. 7A is a plan view illustrating an example of an arrangement of pads in the semiconductor device according to Embodiment 1.
Figure 7B:
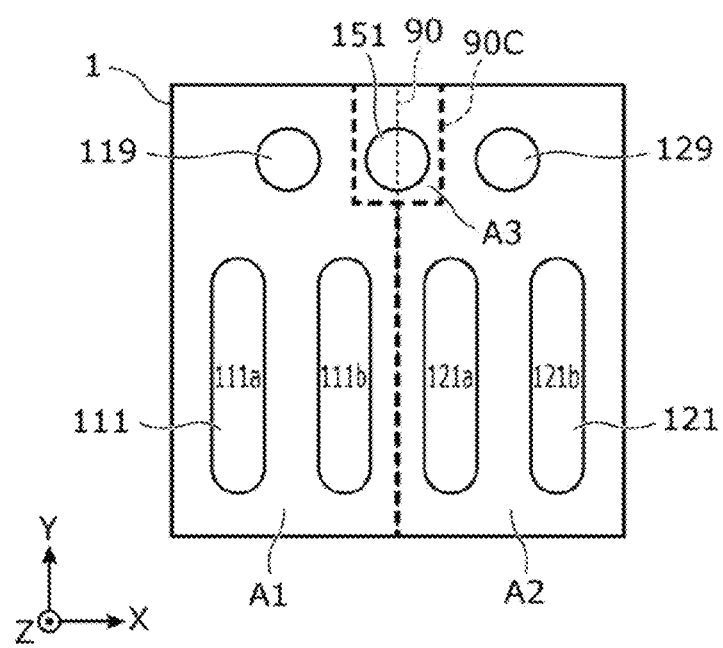
FIG. 7B is a plan view illustrating an example of an arrangement of pads in the semiconductor device according to Embodiment 1.
Figure 7C:
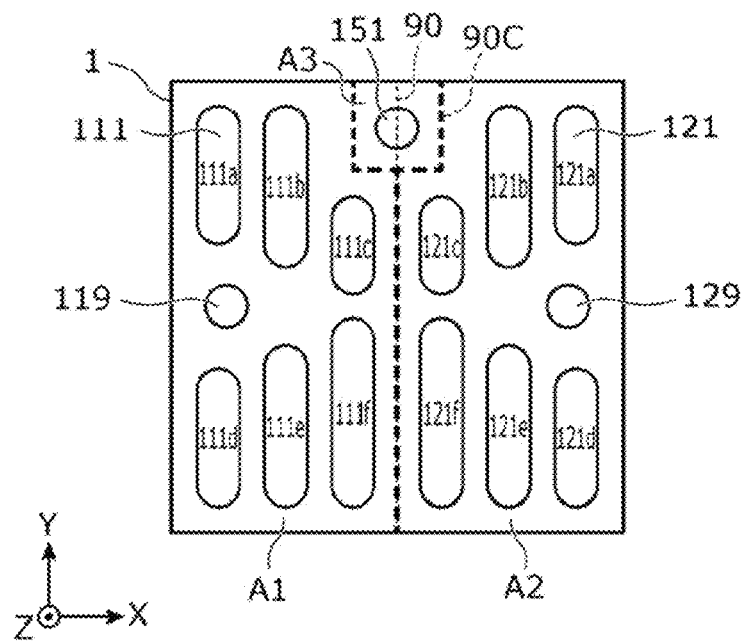
FIG. 7C is a plan view illustrating an example of an arrangement of pads in the semiconductor device according to Embodiment 1.
Figure 7D:
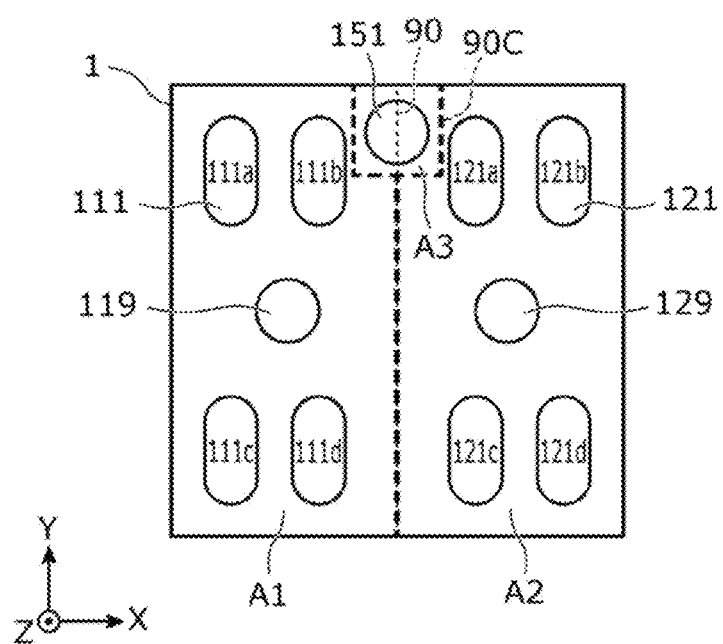
FIG. 7D is a plan view illustrating an example of an arrangement of pads in the semiconductor device according to Embodiment 1.

In particular, when semiconductor layer 40 is in a rectangular shape that has a longer side in a direction orthogonal to the first direction as shown in FIG. 7B, FIG. 7C, and FIG. 7D, semiconductor layer 40 is effective in preventing a solder joint defect.

As shown in FIG. 8A to FIG. 8D, in the plan view of semiconductor layer 40, the center of third region A3 may be located on the center line of semiconductor layer 40 and coincide with the point of intersection between two diagonal lines of semiconductor layer 40, and drain pad 151 may be contained in third region A3.

According to the above-described configuration, compared to the pad arrangements shown in FIG. 7A to FIG. 7D, it is possible to inhibit a solder protrusion mounting defect due to warpage of semiconductor device 1 that occurs at high temperatures in reflow soldering.

Since the warpage of semiconductor device 1 that occurs at high temperatures in reflow soldering curves semiconductor layer 40 in a direction parallel to the longer side of semiconductor layer 40, solder is pressed down more strongly to a mounting substrate side than to a central portion of semiconductor device 1 in a region close to one shorter side of semiconductor layer 40 and a region close to an other shorter side of semiconductor layer 40, and a solder protrusion mounting defect occurs.

However, since drain pad 151 is disposed in the central portion of semiconductor layer 40 by causing semiconductor device 1 to be configured as shown in each of FIG. 8A to FIG. 8D, it is possible to inhibit a solder protrusion mounting defect due to the warpage of semiconductor device 1, compared to a case in which drain pad 151 is disposed in the outer peripheral portion of semiconductor layer 40.

Figure 8A:
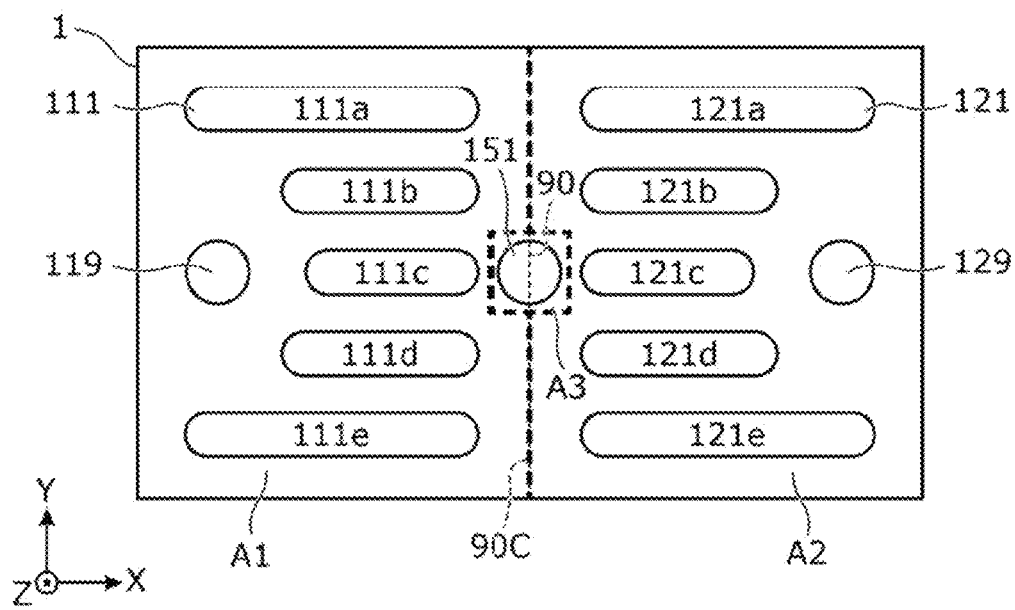
FIG. 8A is a plan view illustrating an example of an arrangement of pads in the semiconductor device according to Embodiment 1.
Figure 8B:
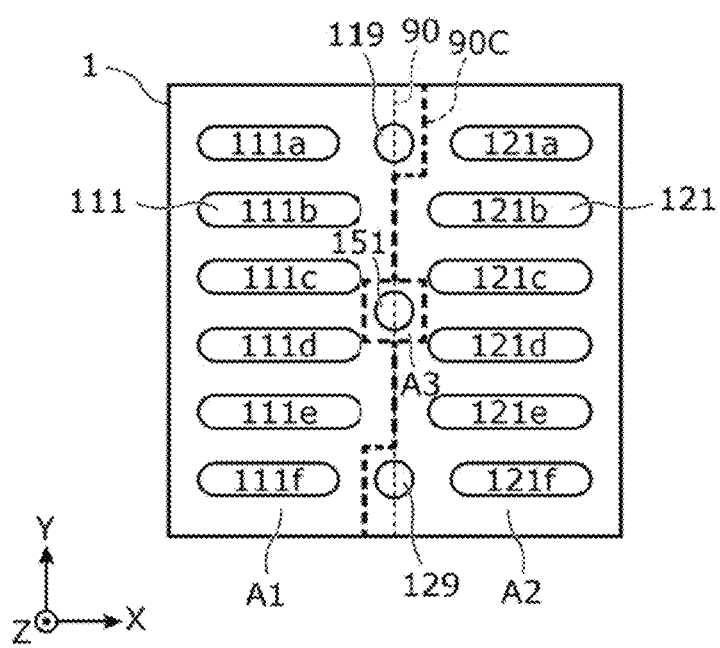
FIG. 8B is a plan view illustrating an example of an arrangement of pads in the semiconductor device according to Embodiment 1.
Figure 8C:
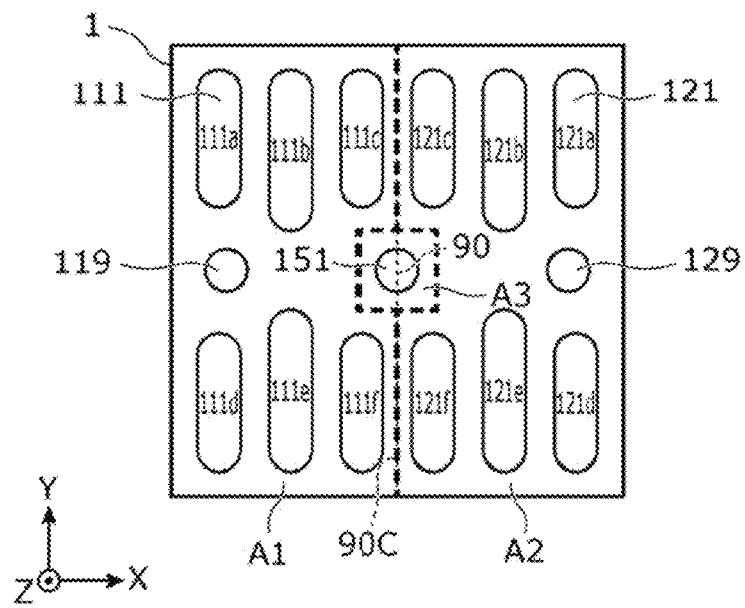
FIG. 8C is a plan view illustrating an example of an arrangement of pads in the semiconductor device according to Embodiment 1.
Figure 8D:
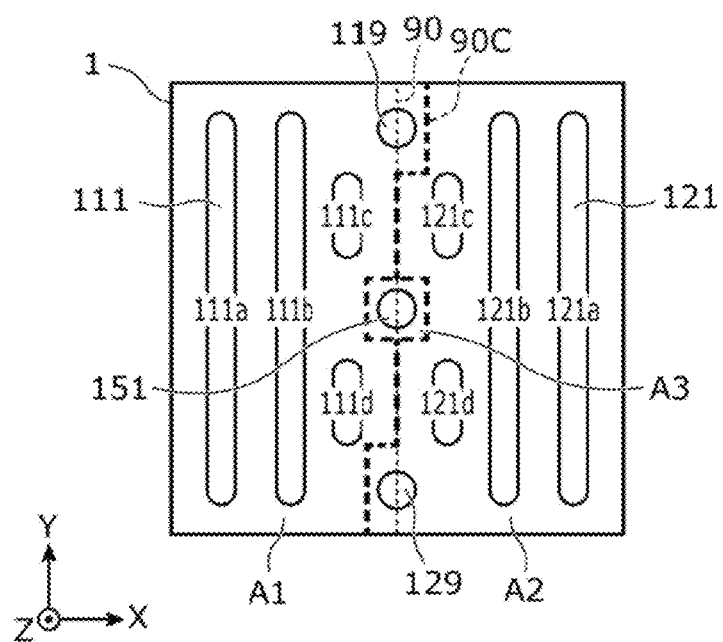
FIG. 8D is a plan view illustrating an example of an arrangement of pads in the semiconductor device according to Embodiment 1.

In particular, when semiconductor layer 40 is in a rectangular shape that has a longer side in a direction orthogonal to the first direction as shown in FIG. 8D, semiconductor layer 40 is effective in preventing a solder protrusion mounting defect, compared to a case in which drain pad 151 is disposed closest to the outer peripheral side of semiconductor layer 40.

It should be noted that, in addition to the above-described configuration, in the plan view of semiconductor layer 40, first gate pad 119, second gate pad 129, and drain pad 151 may each be in a circular shape, have the same diameter, and have the smallest area among pads included in semiconductor layer 40.

According to the above-described configuration, in the plan view of semiconductor layer 40, it is possible to minimize an area of a region that does not contribute to conduction of the primary pathway in semiconductor device 1. For this reason, it is possible to inhibit an increase in conduction resistance of the primary pathway by providing the secondary pathway.

Figure 9A:
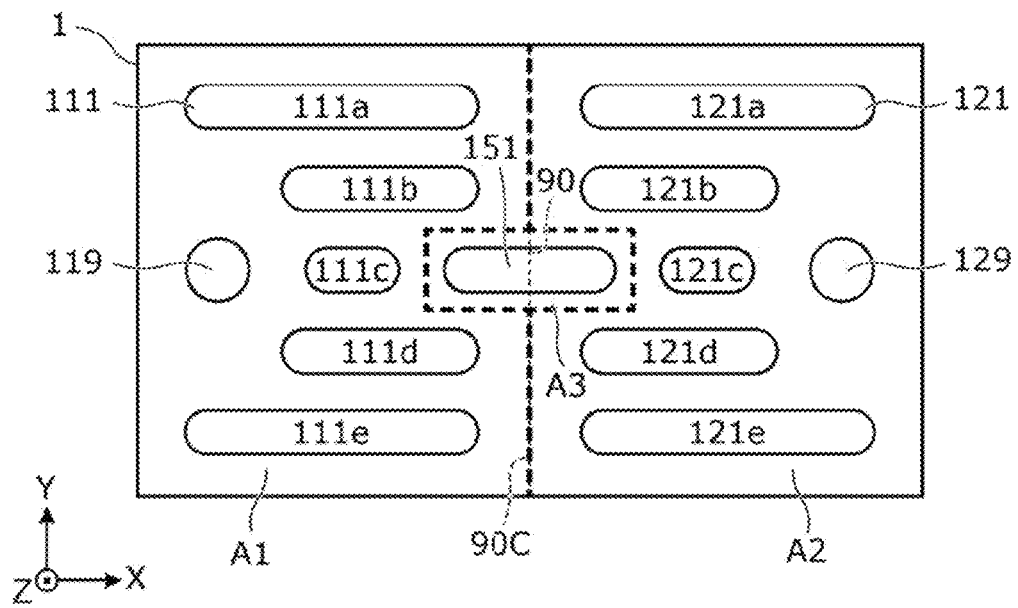
FIG. 9A is a plan view illustrating an example of an arrangement of pads in the semiconductor device according to Embodiment 1.
Figure 9B:
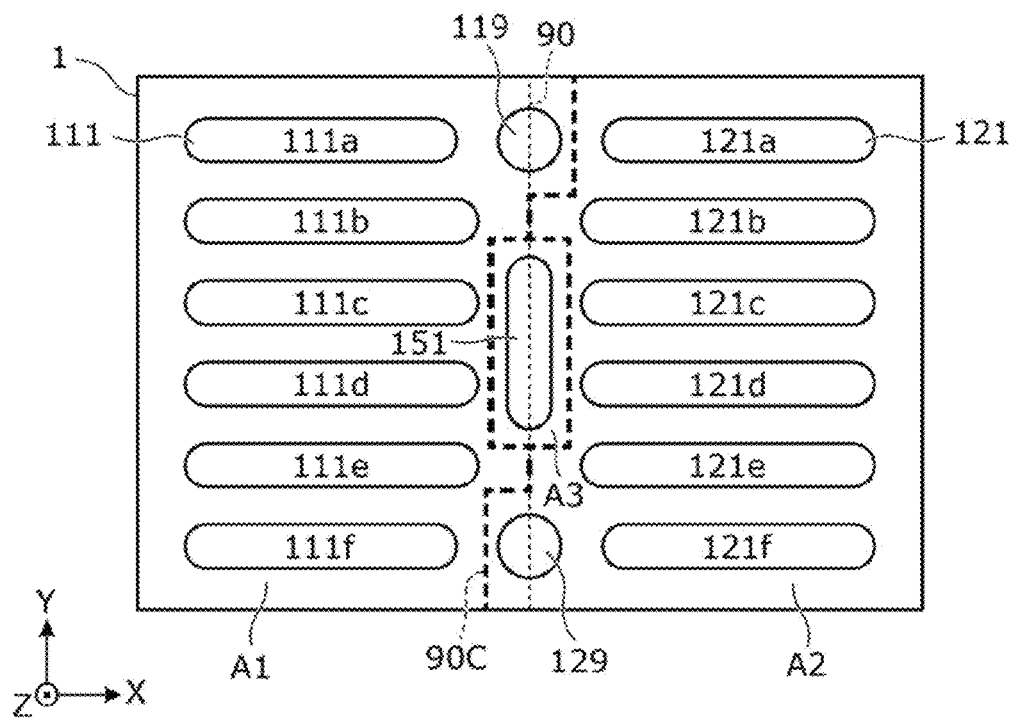
FIG. 9B is a plan view illustrating an example of an arrangement of pads in the semiconductor device according to Embodiment 1.

It should be noted that drain pad 151 is not limited to circular shapes as shown in FIG. 7A to FIG. 7D and FIG. 8A to FIG. 8D. As shown in FIG. 9A and FIG. 9B, drain pad 151 may be in a substantially rectangular shape. A substantially rectangular shape is a generic term that includes not only a rectangle having an end shape that is rectangular but also a semicircle or a polygon.

In FIG. 9A and FIG. 9B, in the plan view of semiconductor layer 40, first gate pad 119 and second gate pad 129 are each in a circular shape and have the same diameter, and first gate pad 119, second gate pad 129, and drain pad 151 are contained in the same stripe-shaped region.

Since an arrangement as shown in FIG. 9A makes it possible to dispose, within the same width in the first direction, first gate pad 119, second gate pad 129, and drain pad 151 that block the principal current flowing bidirectionally in the first direction in a plan view, it is possible to prevent each of first gate pad 119, second gate pad 129, and drain pad 151 from becoming a factor in individually blocking the conduction of the principal current. In addition, since an arrangement as shown in FIG. 9B makes it possible to dispose first gate pad 119, second gate pad 129, and drain pad 151 in the region that does not originally contribute to the conduction of the primary pathway, it is possible to prevent each of first gate pad 119, second gate pad 129, and drain pad 151 from becoming a factor for the increase in conduction resistance of the principal current.

Figure 10A:
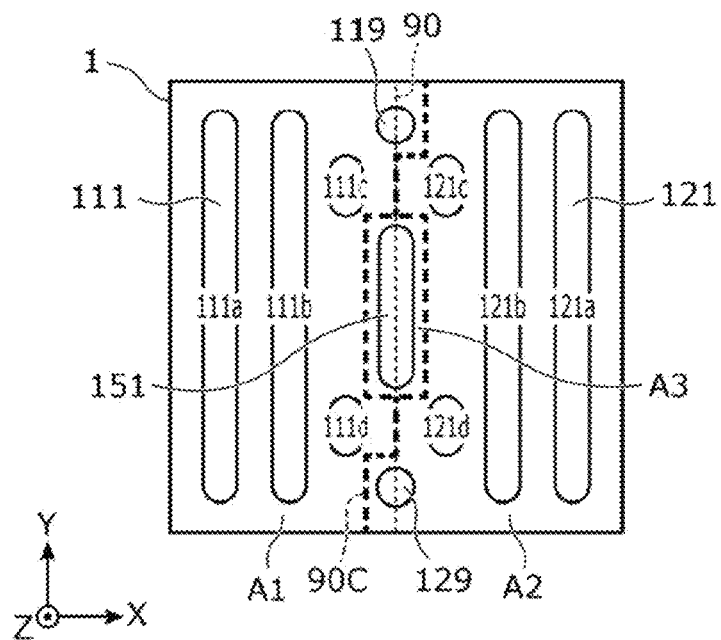
FIG. 10A is a plan view illustrating an example of an arrangement of pads in the semiconductor device according to Embodiment 1.
Figure 10B:
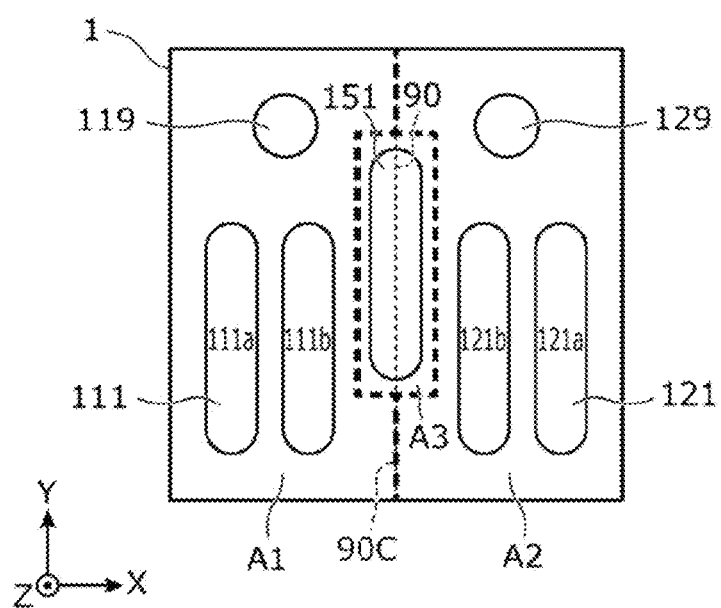
FIG. 10B is a plan view illustrating an example of an arrangement of pads in the semiconductor device according to Embodiment 1.
Figure 10C:
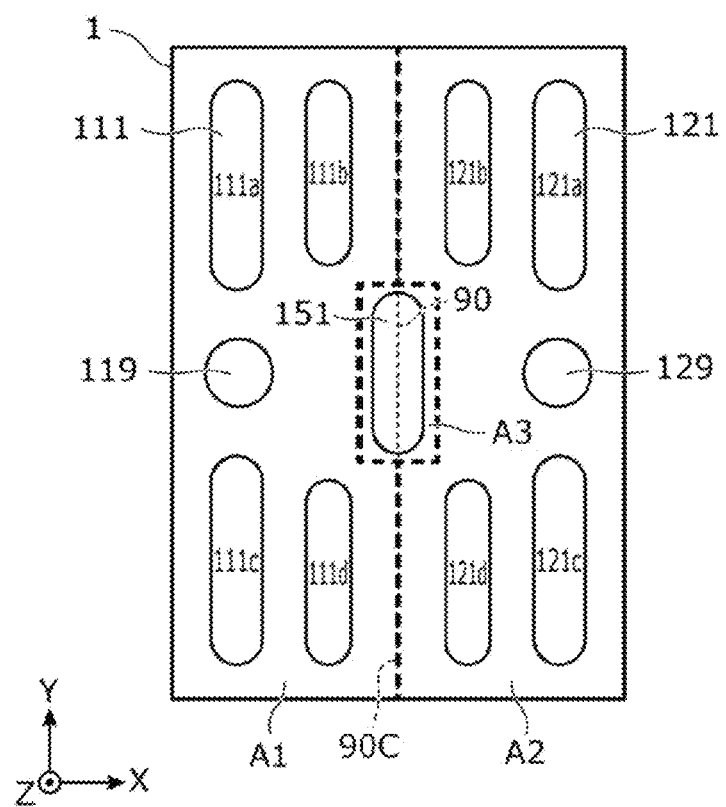
FIG. 10C is a plan view illustrating an example of an arrangement of pads in the semiconductor device according to Embodiment 1.

Moreover, as shown in FIG. 10A to FIG. 10C, in addition to the examples shown in FIG. 7A to FIG. 7D, in the plan view of semiconductor layer 40, semiconductor layer 40 may be in a rectangular shape, drain pad 151 may be in a substantially rectangular shape, and a longitudinal direction of drain pad 151, center line 90 of semiconductor device 1, and a longitudinal direction of semiconductor layer 40 may be parallel to each other.

Since center line 90 and border line 90C usually coincide for the most part in the plan view of semiconductor layer 40, the above-described configuration makes it possible to use third region A3 of semiconductor layer 40 that is the region that does not originally contribute to the conduction of the primary pathway, as a region in which drain pad 151 is disposed, and inhibit the increase in conduction resistance of the primary pathway.

Furthermore, it is possible to inhibit the solder protrusion mounting defect due to the warpage of semiconductor device 1 that occurs at high temperatures in reflow soldering. In the case where semiconductor layer 40 is in a rectangular shape that has a longer side in a direction orthogonal to the first direction, when drain pad 151 is in a substantially rectangular shape that has a longitudinal direction in a direction parallel to a longitudinal direction of semiconductor layer 40, the longitudinal direction of drain pad 151 is parallel to a direction of solder pressed out by the warpage of semiconductor device 1 that occurs at high temperatures in the reflow soldering. Accordingly, it is possible to inhibit solder protrusion, and alleviate the influence of the warpage of semiconductor device 1 that occurs at high temperatures in the reflow soldering on a mounting defect.

Embodiment 2

Semiconductor device 1A according to Embodiment 2 that is configured by changing part of semiconductor device 1 according to Embodiment 1 is described below. Constituent elements of semiconductor device 1A according to Embodiment 2 that are similar to those of semiconductor device 1 are assigned the same reference signs, and the detailed description thereof is omitted, because they have already been described. The following mainly describes differences from semiconductor device 1.

Figure 12A:
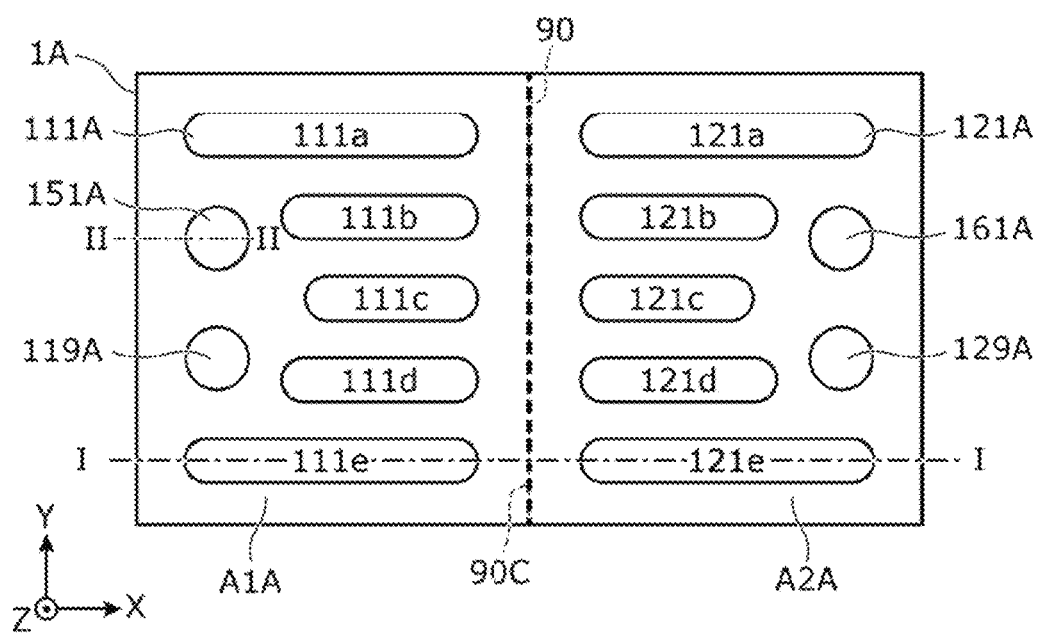
FIG. 12A is a plan view illustrating an example of an arrangement of pads in a semiconductor device according to Embodiment 2.

FIG. 12A is a plan view illustrating an example of an arrangement of pads in semiconductor device 1A according to Embodiment 2. The size and shape of semiconductor device 1A are an example except that semiconductor device 1A is in a rectangular shape. Additionally, the sizes, shapes, and arrangement of the pads are also an example. A cross section along line I-I in FIG. 12A is equivalent to FIG. 1 illustrating the cross section along line I-I in FIG. 2A illustrating the example of the arrangement of the pads in semiconductor device 1 according to Embodiment 1.

Transistor 10 of semiconductor device 1 according to Embodiment 1 in FIG. 1 corresponds to first vertical MOS transistor 10A (hereinafter also referred to as transistor 10A) in semiconductor device 1A according to Embodiment 2 shown in FIG. 12B.

Similarly, transistor 20 of semiconductor device 1 according to Embodiment 1 in FIG. 1 corresponds to second vertical MOS transistor 20A (hereinafter also referred to as transistor 20A) in semiconductor device 1A according to Embodiment 2 shown in FIG. 12B.

First region A1 and second region A2 of semiconductor device 1 according to Embodiment 1 in FIG. 2A correspond to first region A1A and second region A2A in semiconductor device 1A according to Embodiment 2 shown in FIG. 12A, respectively.

Moreover, the plurality of first source pads 111 and first gate pad 119 of semiconductor device 1 according to Embodiment 1 in FIG. 2A correspond to a plurality of first source pads 111A and first gate pad 119A in semiconductor device 1A according to Embodiment 2 shown in FIG. 12A, respectively.

Similarly, the plurality of second source pads 121 and second gate pad 129 of semiconductor device 1 according to Embodiment 1 in FIG. 2A correspond to a plurality of second source pads 121A and second gate pad 129A in semiconductor device 1A according to Embodiment 2 shown in FIG. 12A, respectively.

As shown in FIG. 12A and FIG. 1, semiconductor device 1A includes: semiconductor layer 40; metal layer 41; transistor 10A provided in first region A1A in semiconductor layer 40; and transistor 20A provided in second region A2A in semiconductor layer 40. Semiconductor device 1A according to Embodiment 2 differs from semiconductor device 1 according to Embodiment 1 in not including third region A3.

Figure 12B:
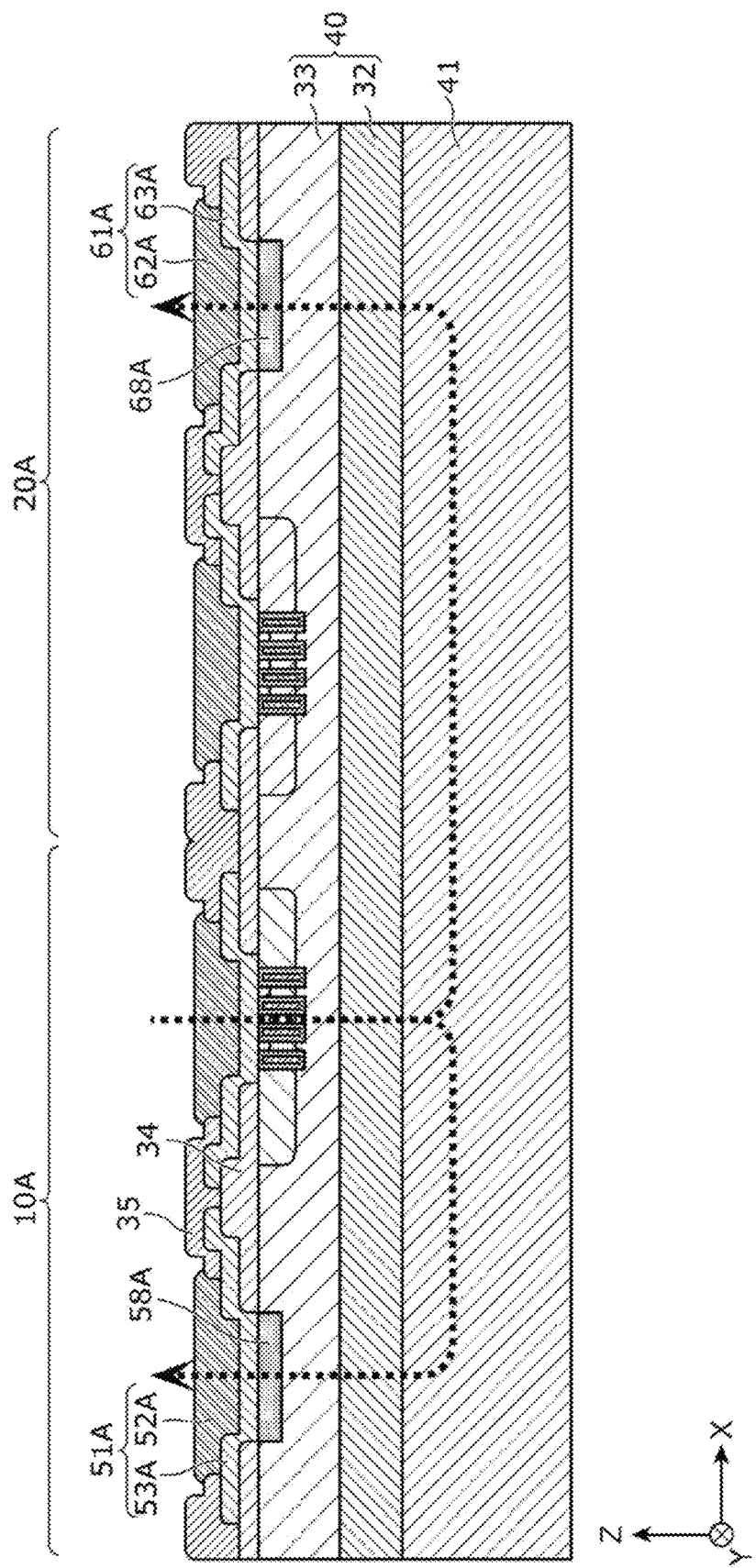
FIG. 12B is a cross-sectional view illustrating a secondary current flowing through the semiconductor device according to Embodiment 2.
Figure 13A:
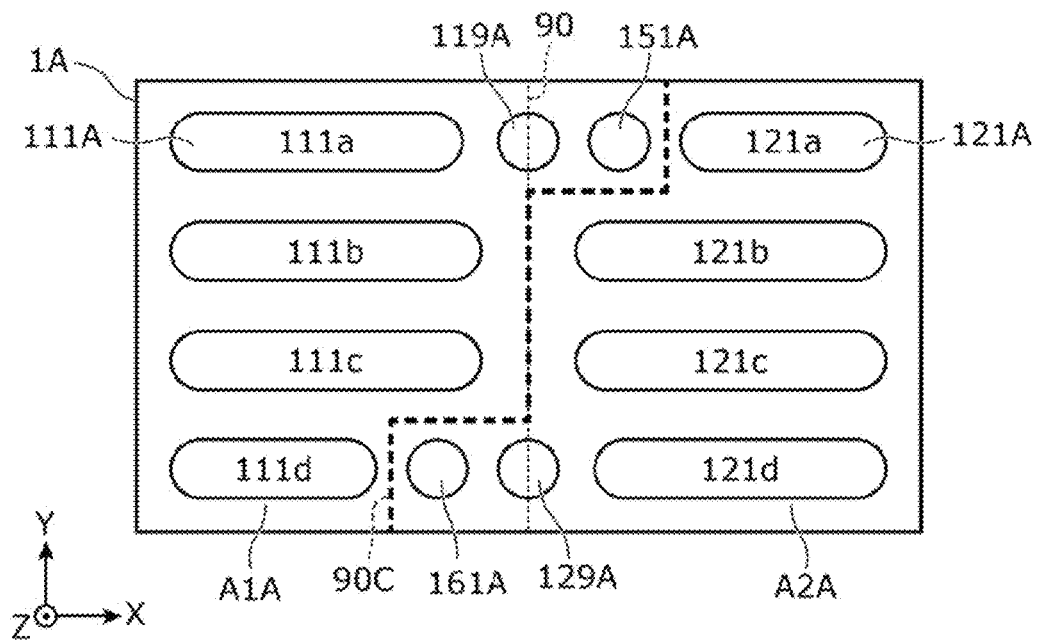
FIG. 13A is a plan view illustrating an example of an arrangement of pads in the semiconductor device according to Embodiment 2.
Figure 13B:
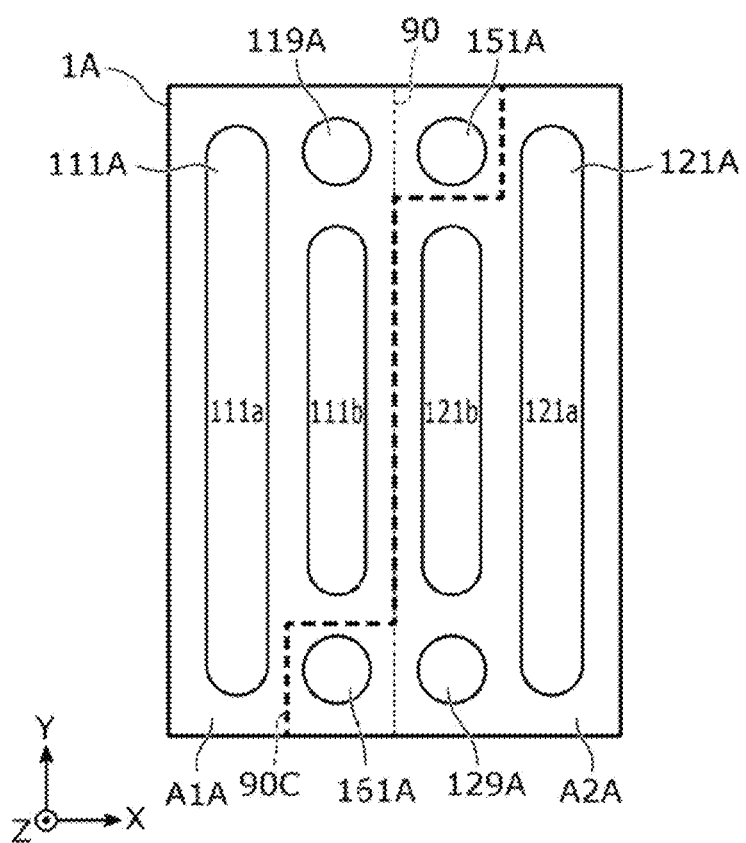
FIG. 13B is a plan view illustrating an example of an arrangement of pads in the semiconductor device according to Embodiment 2.
Figure 13C:
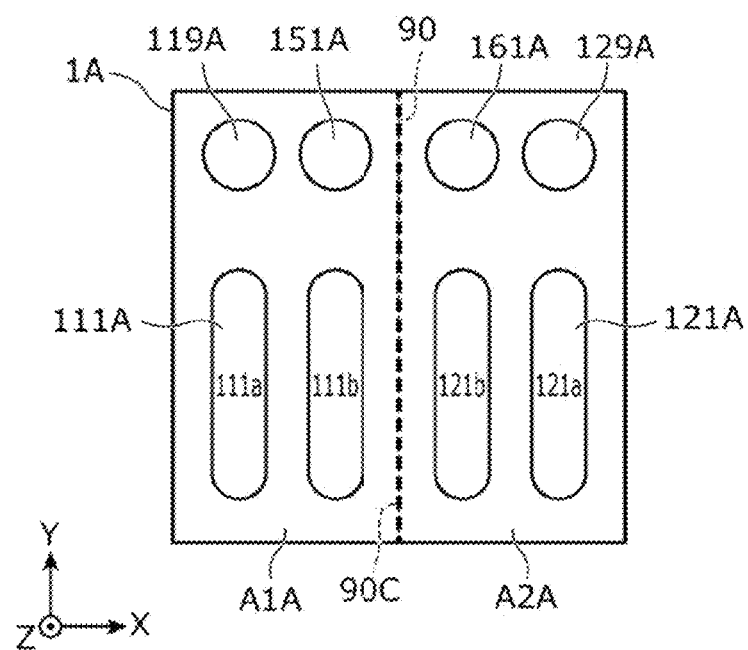
FIG. 13C is a plan view illustrating an example of an arrangement of pads in the semiconductor device according to Embodiment 2.

As shown in FIG. 12A, FIG. 12B, and FIG. 1, first region A1A of semiconductor device 1A according to Embodiment 2 includes first drain electrode 51A in addition to the constituent elements of first region A1 of semiconductor device 1 according to Embodiment 1.

Similarly, second region A2A of semiconductor device 1A includes second drain electrode 61A in addition to the constituent elements of second region A2 of semiconductor device 1 according to Embodiment 1.

A cross section along line II-II in FIG. 12A, that is, a cross section of first drain electrode 51A is equivalent to that in FIG. 3A. It should be noted that the same applies to a cross section of second drain electrode 61A.

Portion 52 of semiconductor device 1 according to Embodiment 1 in FIG. 3A corresponds to portion 52A and portion 62A in semiconductor device 1A according to Embodiment 2.

Furthermore, portion 53 of semiconductor device 1 according to Embodiment 1 in FIG. 3A corresponds to portion 53A and portion 63A in semiconductor device 1A according to Embodiment 2.

Similarly, drain electrode 51 including portion 52 and portion 53 of semiconductor device 1 according to Embodiment 1 in FIG. 3A corresponds to first drain electrode 51A that includes portion 52A and portion 53A and second drain electrode 61A that includes portion 62A and portion 63A in semiconductor device 1A according to Embodiment 2.

Moreover, drain lead-out region 58 of semiconductor device 1 according to Embodiment 1 in FIG. 3A corresponds to first drain lead-out region 58A and second drain lead-out region 68A in semiconductor device 1A according to Embodiment 2.

First drain lead-out region 58A of the first conductivity type containing impurities of the first conductivity type having a concentration higher than a concentration of impurities of the first conductivity type in low-concentration impurity layer 33 of first region A1A is provided inside low-concentration impurity layer 33 of first region A1A. It should be noted that first drain lead-out region 58A may be provided to a depth that reaches semiconductor substrate 32, inside low-concentration impurity layer 33.

First drain electrode 51A includes portion 52A and portion 53A. Portion 52A is connected to first drain lead-out region 58A via portion 53A.

Portion 52A of first drain electrode 51A is a layer joined with solder at the time of reflow in facedown mounting, and may comprise a metal material including at least one of nickel, titanium, tungsten, or palladium as a non-limiting example. The surface of portion 52A may be plated with gold etc.

Portion 53A of first drain electrode 51A is a layer that connects portion 52A and first drain lead-out region 58A. Accordingly, first drain electrode 51A has the same electric potential as a common drain region between transistor 10A and transistor 20A. Moreover, portion 53A of first drain electrode 51A may comprise, as a non-limiting example, a metal material including at least one of aluminum, copper, gold, or silver.

As shown in FIG. 3A and FIG. 12B, low-concentration impurity layer 33 is covered with interlayer insulating layer 34 having an opening, and portion 53A of first drain electrode 51A is connected to first drain lead-out region 58A via the opening of interlayer insulating layer 34. Interlayer insulating layer 34 and portion 53A of first drain electrode 51A are covered with passivation layer 35 having an opening, and portion 52A is connected to portion 53A of first drain electrode 51A via the opening of passivation layer 35.

Accordingly, first drain pad 151A refers to a region in which first drain electrode 51A is partially exposed to the surface of semiconductor device 1A, that is, a terminal portion.

Similarly, second drain lead-out region 68A of the first conductivity type containing impurities of the first conductivity type having a concentration higher than a concentration of impurities of the first conductivity type in low-concentration impurity layer 33 of second region A2A is provided inside low-concentration impurity layer 33 of second region A2A. It should be noted that second drain lead-out region 68A may be provided to a depth that reaches semiconductor substrate 32, inside low-concentration impurity layer 33.

Second drain electrode 61A includes portion 62A and portion 63A. Portion 62A is connected to second drain lead-out region 68A via portion 63A.

Portion 62A of second drain electrode 61A is a layer joined with solder at the time of reflow in facedown mounting, and may comprise a metal material including at least one of nickel, titanium, tungsten, or palladium as a non-limiting example. The surface of portion 62A may be plated with gold etc.

Portion 63A of second drain electrode 61A is a layer that connects portion 62A and second drain lead-out region 68A. Accordingly, second drain electrode 61A has the same electric potential as the common drain region between transistor 10A and transistor 20A. Moreover, portion 63A of second drain electrode 61A may comprise, as a non-limiting example, a metal material including at least one of aluminum, copper, gold, or silver.

As shown in FIG. 3A and FIG. 12B, low-concentration impurity layer 33 is covered with interlayer insulating layer 34 having an opening, and portion 63A of second drain electrode 61A is connected to second drain lead-out region 68A via the opening of interlayer insulating layer 34. Interlayer insulating layer 34 and portion 63A of second drain electrode 61A are covered with passivation layer 35 having an opening, and portion 62A is connected to portion 63A of second drain electrode 61A via the opening of passivation layer 35.

Accordingly, second drain pad 161A refers to a region in which second drain electrode 61A is partially exposed to the surface of semiconductor device 1A, that is, a terminal portion.

As shown in FIG. 1, FIG. 3A, and FIG. 12A, transistor 10A includes, on the front surface of semiconductor layer 40, a plurality of first source pads 111A, first gate pad 119A, and first drain pad 151A that are joined to the mounting substrate via a bonding material at the time of facedown mounting. Additionally, transistor 20A includes, on the front surface of semiconductor layer 40, a plurality of second source pads 121A, second gate pad 129A, and second drain pad 161A that are joined to the mounting substrate via the bonding material at the time of facedown mounting.

As shown in FIG. 1 and FIG. 12A, semiconductor device 1A and semiconductor layer 40 are each in a rectangular shape in a plan view. It should be noted that although semiconductor device 1A and semiconductor layer 40 are each in the rectangular shape in FIG. 12A, semiconductor device 1A and semiconductor layer 40 may each be in a square shape.

Among directions parallel to the outer peripheral sides of semiconductor device 1A in the plan view, a direction in which first region A1A and second region A2A are arranged is defined as a first direction. First region A1A and second region A2A being arranged in the first direction in the plan view means that first region A1A and second region A2A face each other most in the first direction.

Facing each other most in the first direction means that border line 90C between first region A1A and second region A2A that is described later has a longest portion orthogonal to the first direction in the plan view. For example, when border line 90C is in a crank shape in the plan view, border line 90C is divided into constituent line segments, and a direction that is orthogonal to a direction in which the sum of line segments in the same direction is longest is defined as the first direction.

As shown in FIG. 12A, in the plan view of semiconductor layer 40, first region A1A and second region A2A are one region and an other region that are adjacent to each other and divide an area of semiconductor layer 40 in half.

As shown in FIG. 12A, center line 90 is a line that divides semiconductor layer 40 in half in the first direction in the plan view of semiconductor layer 40. Accordingly, center line 90 is a straight line in a direction orthogonal to the first direction in the plan view of semiconductor layer 40.

Moreover, in the plan view of semiconductor layer 40, a middle point of a line segment that connects the center of first gate pad 119A of transistor 10A and the center of second gate pad 129A of transistor 20A is located on border line 90C of semiconductor device 1A.

Furthermore, in the plan view of semiconductor layer 40, a middle point of a line segment that connects the center of first drain pad 151A of transistor 10A and the center of second drain pad 161A of transistor 20A is located on border line 90C of semiconductor device 1A.

Moreover, as shown in FIG. 12A, no portion of first source pad 111A is disposed between first gate pad 119A and first drain pad 151A. Accordingly, first gate pad 119A and first drain pad 151A are disposed adjacent to each other.

Similarly, no portion of second source pad 121A is disposed between second gate pad 129A and second drain pad 161A. Accordingly, second gate pad 129A and second drain pad 161A are disposed adjacent to each other.

As shown in FIG. 12A, in the plan view of semiconductor layer 40, first gate pad 119A and second gate pad 129A of semiconductor device 1A are in the same shape and have the same area. In addition, first drain pad 151A and second drain pad 161A are in the same shape and have the same area.

It should be noted that, as in FIG. 12A, first gate pad 119A, second gate pad 129A, first drain pad 151A, and second drain pad 161A may be in the same shape and have the same area.

A principal current and a primary pathway of semiconductor device 1A according to Embodiment 2 are similar to those of semiconductor device 1 according to Embodiment 1.

FIG. 12B is a cross-sectional view illustrating a secondary current flowing through semiconductor device 1A. The secondary current of semiconductor device 1A is similar to that of semiconductor device 1 according to Embodiment 1, is a current the conduction of which is controlled by an external switching element connected in series with first drain electrode 51A and second drain electrode 61A of semiconductor device 1A, and is a relatively small current compared to the principal current. A conducting pathway for the secondary current of semiconductor device 1A is described below.

In semiconductor device 1A, when a high voltage is applied to first source electrode 11, a low voltage is applied to first drain electrode 51A and second drain electrode 61A, and the external switching element connected in series with first drain electrode 51A and second drain electrode 61A becomes conductive, the secondary current flows in a pathway from first source electrode 11 to first connector 18a to first body region 18 to low-concentration impurity layer 33 to semiconductor substrate 32 to metal layer 41 to semiconductor substrate 32 to low-concentration impurity layer 33 to first drain lead-out region 58A to first drain electrode 51A, and semiconductor device 1A becomes conductive. It should be noted that at this time the secondary current may also flow in a pathway from first source electrode 11 to first connector 18a to first body region 18 to low-concentration impurity layer 33 to semiconductor substrate 32 to metal layer 41 to semiconductor substrate 32 to low-concentration impurity layer 33 to second drain lead-out region 68A to second drain electrode 61A.

Moreover, when a high voltage is applied to first source electrode 11, a low voltage is applied to first drain electrode 51A and second drain electrode 61A, the external switching element becomes conductive, and a voltage higher than or equal to a threshold value with reference to first source electrode 11 is applied to first gate electrode 19, a conducting channel is formed in the vicinity of first gate insulating film 16 in first body region 18, the secondary current flows in a pathway from first source electrode 11 to first source region 14 to the conducting channel formed in first body region 18 to low-concentration impurity layer 33 to semiconductor substrate 32 to metal layer 41 to semiconductor substrate 32 to low-concentration impurity layer 33 and then in a pathway from first drain lead-out region 58A to first drain electrode 51A or a pathway from second drain lead-out region 68A to second drain electrode 61A, and semiconductor device 1A becomes conductive.

Similarly, when a high voltage is applied to second source electrode 21, a low voltage is applied to first drain electrode 51A and second drain electrode 61A, and the external switching element connected in series with first drain electrode 51A and second drain electrode 61A becomes conductive, the secondary current flows in a pathway from second source electrode 21 to second connector 28a to second body region 28 to low-concentration impurity layer 33 to semiconductor substrate 32 to metal layer 41 to semiconductor substrate 32 to low-concentration impurity layer 33 to second drain lead-out region 68A to second drain electrode 61A, and semiconductor device 1A becomes conductive. It should be noted that at this time the secondary current may also flow in a pathway from second source electrode 21 to second connector 28a to second body region 28 to low-concentration impurity layer 33 to semiconductor substrate 32 to metal layer 41 to semiconductor substrate 32 to low-concentration impurity layer 33 to first drain lead-out region 58A to first drain electrode 51A.

Furthermore, when a high voltage is applied to second source electrode 21, a low voltage is applied to first drain electrode 51A and second drain electrode 61A, the external switching element becomes conductive, and a voltage higher than or equal to a threshold value with reference to second source electrode 21 is applied to second gate electrode 29, a conducting channel is formed in the vicinity of second gate insulating film 26 in second body region 28, the secondary current flows in a pathway from second source electrode 21 to second source region 24 to the conducting channel formed in second body region 28 to low-concentration impurity layer 33 to semiconductor substrate 32 to metal layer 41 to semiconductor substrate 32 to low-concentration impurity layer 33 and then in a pathway from second drain lead-out region 68A to second drain electrode 61A or a pathway from first drain lead-out region 58A to first drain electrode 51A, and semiconductor device 1A becomes conductive.

Those conducting pathways in which the secondary current flows are secondary pathways in semiconductor device 1A. A secondary pathway in semiconductor device 1A is controlled by causing the external switching element connected in series with first drain electrode 51A and second drain electrode 61A to be conductive or non-conductive. When the switching element is conductive, the secondary pathway in semiconductor device 1A becomes conductive.

When the primary pathway becomes conductive, since it is necessary to cause the external switching element connected in series with first drain electrode 51A and second drain electrode 61A to be non-conductive, the secondary pathway becomes non-conductive, and only the primary pathway becomes conductive.

FIG. 12C is a plan view obtained by enlarging a portion in which first drain pad 151A and first gate pad 119A shown in FIG. 12A are disposed. FIG. 12C is an example of shapes of, among the constituent elements of semiconductor device 1A, portion 13 of first source electrode 11, portion 53A of first drain electrode 51A, first drain pad 151A, first gate electrode 19, first gate pad 119A, the first EQR, and a first gate resistive element in the plan view of semiconductor layer 40.

The gate resistive element is electrically connected to a gate electrode, and is disposed in expectation of a protective function that prevent transistor from breaking down when an excess voltage is applied to the gate electrode. In other words, the gate resistive element is an element disposed to improve electrostatic discharge (ESD) tolerance.

It should be noted that a gate resistive element and an EQR are not necessarily disposed, and may or may not be disposed in the semiconductor device according to the present disclosure.

For the sake of clarity of the top surface structure of semiconductor layer 40 that cannot be actually viewed, passivation layer 35 and interlayer insulating layer 34 are omitted from FIG. 12C as if they are transparent. In addition, first source region 14 and first drain lead-out region 58A are also omitted from the figure.

Although not shown in the figure, portion 23 of second source electrode 21, portion 63A of second drain electrode 61A, second drain pad 161A, second gate electrode 29, second gate pad 129A, the second EQR, and a second gate resistive element are each in a shape that is line-symmetrical to a corresponding one of portion 13 of first source electrode 11, portion 53A of first drain electrode 51A, first drain pad 151A, first gate electrode 19, first gate pad 119A, the first EQR, or the first gate resistive element shown in FIG. 12C with reference to center line 90 as a symmetrical axis.

A region immediately below first drain electrode 51A and a proximate region of the region, and a region immediately below second drain electrode 61A and a proximate region of the region, are regions that do not contribute to conduction of the primary pathway. Here, the proximate regions are regions along the outer peripheries of first drain electrode 51A and second drain electrode 61A, and may be considered as a region between portion 53A of first drain electrode 51A and portion 13 of first source electrode 11 shown in FIG. 12C and a region between portion 63A of second drain electrode 61A and portion 23 of second source electrode 21 not shown in the figure.

To put it another way, in semiconductor device 1A, although a region immediately below first gate electrode 19 and a proximate region of the region, the region immediately below first drain electrode 51A and the proximate region, a region immediately below second gate electrode 29 and a proximate region of the region, and the region immediately below second drain electrode 61A and the proximate region, are regions necessary for semiconductor device 1A to function, they are regions the reduction of which is desired as much as possible in a limited device area to reduce the conduction resistance of the primary pathway in semiconductor device 1A.

It should be noted that, as shown in FIG. 12C, the first gate resistive element may be disposed at a position between first gate pad 119A and first drain pad 151A in the plan view of semiconductor layer 40. Additionally, portion 53A of first drain electrode 51A and the first EQR may be directly connected to each other.

Similarly, although not shown in the figure, the second gate resistive element may be disposed at a position between second gate pad 129A and second drain pad 161A in the plan view of semiconductor layer 40. Additionally, portion 63A of second drain electrode 61A and the second EQR may be directly connected to each other.

Above-described semiconductor device 1A in the present disclosure has the following characteristics.

Semiconductor device 1A according to one aspect of the present disclosure is facedown mountable, chip-size-package type semiconductor device 1A, semiconductor device 1A including: semiconductor substrate 32; low-concentration impurity layer 33 that is provided on semiconductor substrate 32; first vertical MOS transistor 10A that is provided in first region A1A of semiconductor layer 40 that is a combination of semiconductor substrate 32 and low-concentration impurity layer 33; second vertical MOS transistor 20A that is provided in second region A2A adjacent to first region A1A in a plan view of semiconductor layer 40; a plurality of first source pads 111A that are provided in first region A1A in the plan view and connected to first source electrode 11 of first vertical MOS transistor 10A; first gate pad 119A that is provided in first region A1A in the plan view and connected to first gate electrode 19 of first vertical MOS transistor 10A; first drain pad 151A that is provided in first region A1A in the plan view and connected to first drain electrode 51A of first vertical MOS transistor 10A; a plurality of second source pads 121A that are provided in second region A2A in the plan view and connected to second source electrode 21 of second vertical MOS transistor 20A; second gate pad 129A that is provided in second region A2A in the plan view and connected to second gate electrode 29 of second vertical MOS transistor 20A; second drain pad 161A that is provided in second region A2A in the plan view and connected to second drain electrode 61A of second vertical MOS transistor 20A; and metal layer 41 that is provided in contact with a back surface of semiconductor substrate 32. Semiconductor substrate 32 is a common drain region for first vertical MOS transistor 10A and second vertical MOS transistor 20A. In the plan view, semiconductor layer 40 is in a rectangular shape. In the plan view, first region A1A and second region A2A are one region and an other region that divide an area of semiconductor layer 40 in half. In the plan view, a middle point of a line segment that connects a center of first gate pad 119A and a center of second gate pad 129A is located on border line 90C between first region A1A and second region A2A. In the plan view, a middle point of a line segment that connects a center of first drain pad 151A and a center of second drain pad 161A is located on border line 90C. No portion of first source pad 111A is disposed between first gate pad 119A and first drain pad 151A. No portion of second source pad 121A is disposed between second gate pad 129A and second drain pad 161A.

FIG. 13A to FIG. 13C, FIG. 14A to FIG. 14D, FIG. 15A, FIG. 15B, and FIG. 16A to FIG. 16D are each a plan view illustrating an example of an arrangement of pads that satisfies conditions for semiconductor device 1A according to Embodiment 2.

According to the above-described configuration, in the plan view of semiconductor layer 40, first gate pad 119A and first drain pad 151A are disposed adjacent to each other, and second gate pad 129A and second drain pad 161A are disposed adjacent to each other. Since a current density of the principal current is originally unlikely to increase relatively in a region around first gate pad 119A and a region around first drain pad 151A even though the regions are first active region 112, when it is possible to dispose first gate pad 119A and first drain pad 151A adjacent to each other, it is possible to expand an area that first active region 112 is capable of being used effectively, compared to a case in which first gate pad 119A and first drain pad 151A are disposed apart from each other. Similarly, when it is possible to dispose second gate pad 129A and second drain pad 161A adjacent to each other, it is possible to expand an area that second active region 122 is capable of being used effectively, compared to a case in which second gate pad 129A and second drain pad 161A are disposed apart from each other. For this reason, it is possible to inhibit an increase in conduction resistance of the primary pathway due to the inclusion of the secondary pathway as much as possible.

Moreover, since it is possible to dispose first gate pad 119A, first drain pad 151A, second gate pad 129A, and second drain pad 161A to cause (i) first gate pad 119A and second gate pad 129A and (ii) first drain pad 151A and second drain pad 161A to be line-symmetrical with reference to border line 90C as a symmetrical axis or point-symmetrical with reference to the center of semiconductor layer 40 as a point of symmetry in the plan view of semiconductor layer 40, even though the secondary pathway is provided, it is difficult to prevent first active region 112 and second active region 122 from becoming identical in area and shape. Accordingly, a lack of balance in electrical characteristics of the bidirectional conduction and heat dissipation property between transistor 10A and transistor 20A is less likely to occur.

As shown in FIG. 14A to FIG. 14D, first drain pad 151A and first gate pad 119A may be arranged in a direction parallel to border line 90C, and no portion of an other pad may be disposed between first drain pad 151A and an outer peripheral side of semiconductor layer 40 closest to first drain pad 151A.

Similarly, second drain pad 161A and second gate pad 129A may be arranged in the direction parallel to border line 90C, and no portion of an other pad may be disposed between second drain pad 161A and an outer peripheral side of semiconductor layer 40 closest to second drain pad 161A.

According to the above-described configuration, since it is possible to dispose first drain pad 151A, first gate pad 119A, second drain pad 161A, and second gate pad 129A close to the outer peripheral sides of semiconductor layer 40 in the plan view of semiconductor layer 40, it is possible to reduce the possibility of a solder joint defect occurring due to warpage of semiconductor device 1A, compared to a case in which first drain pad 151A, first gate pad 119A, second drain pad 161A, and second gate pad 129A are disposed at the center of semiconductor layer 40.

Figure 14A:
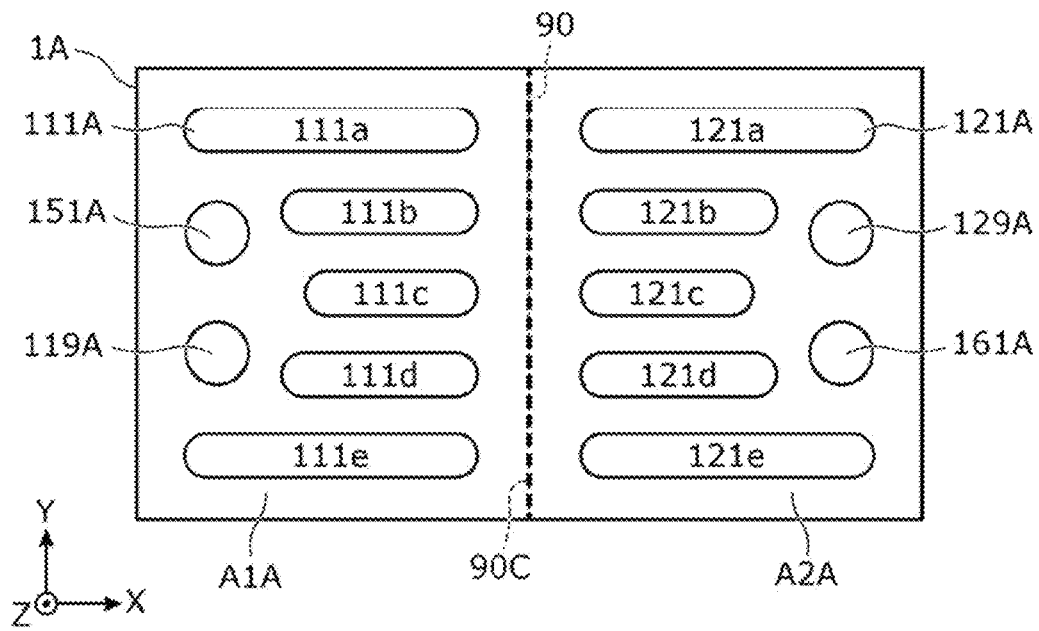
FIG. 14A is a plan view illustrating an example of an arrangement of pads in the semiconductor device according to Embodiment 2.
Figure 14B:
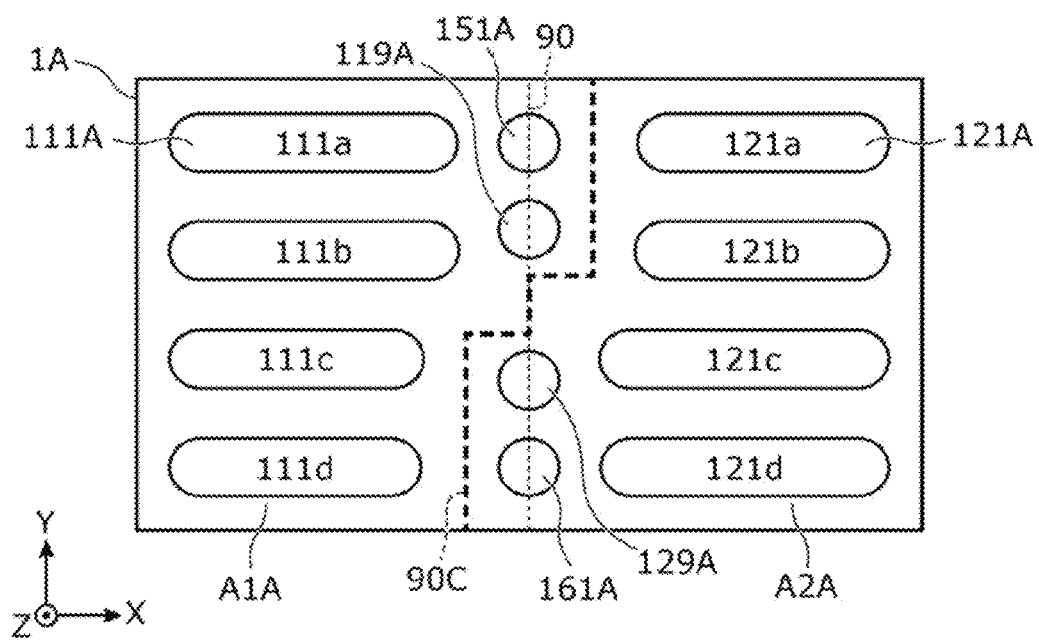
FIG. 14B is a plan view illustrating an example of an arrangement of pads in the semiconductor device according to Embodiment 2.
Figure 14C:
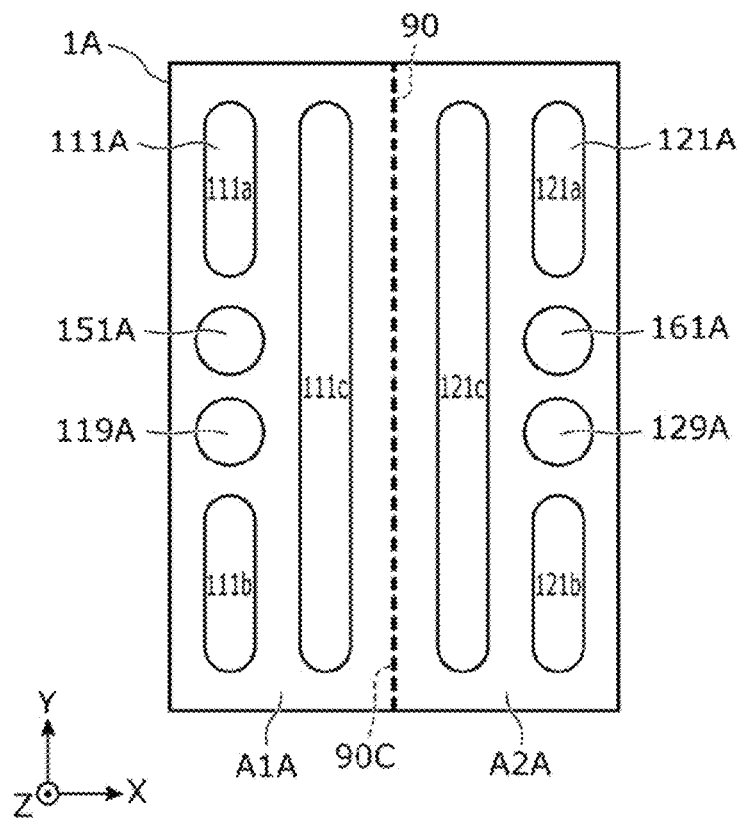
FIG. 14C is a plan view illustrating an example of an arrangement of pads in the semiconductor device according to Embodiment 2.
Figure 14D:
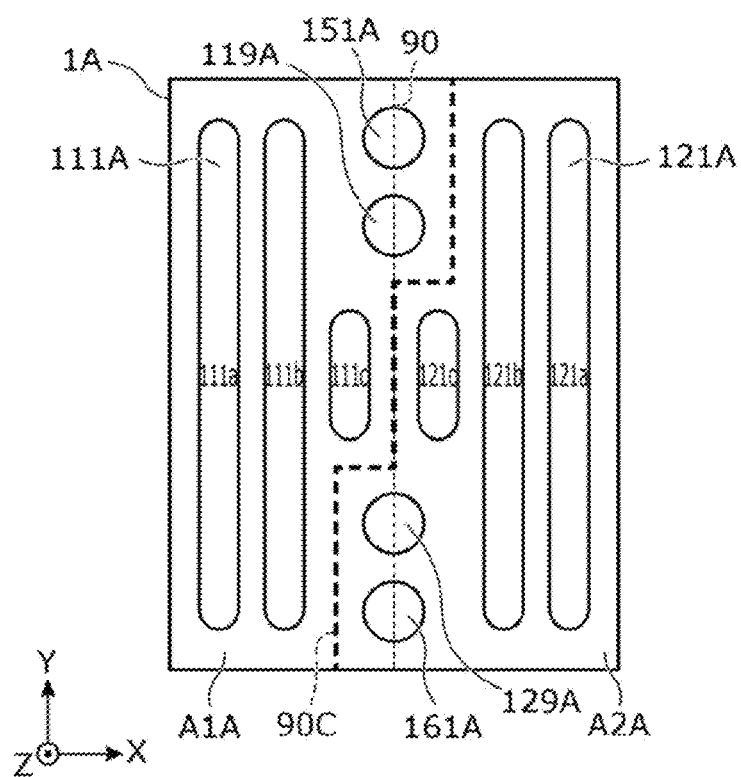
FIG. 14D is a plan view illustrating an example of an arrangement of pads in the semiconductor device according to Embodiment 2.

As shown in FIG. 14A, for example, the arrangement of first drain pad 151A and first gate pad 119A and the arrangement of second drain pad 161A and second gate pad 129A may be alternated. In this case, although (i) first gate pad 119A and second gate pad 129A and (ii) first drain pad 151A and second drain pad 161A are not line-symmetrical with reference to border line 90C as the symmetrical axis, it is possible to dispose (i) first gate pad 119A and second gate pad 129A and (ii) first drain pad 151A and second drain pad 161A to be point-symmetrical with reference to the center of semiconductor layer 40 as the center of symmetry.

Figure 15A:
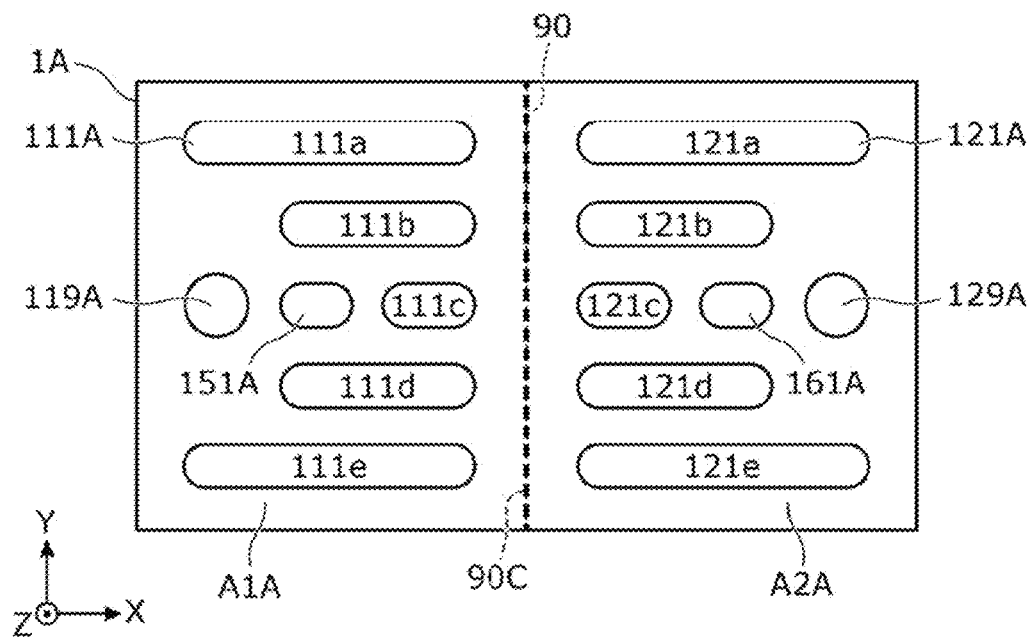
FIG. 15A is a plan view illustrating an example of an arrangement of pads in the semiconductor device according to Embodiment 2.

It should be noted that first drain pad 151A and second drain pad 161A is not limited to circular shapes as shown in FIG. 14A to FIG. 14D. As shown in FIG. 15A, first drain pad 151A and second drain pad 161A may each be in a substantially rectangular shape.

Figure 15B:
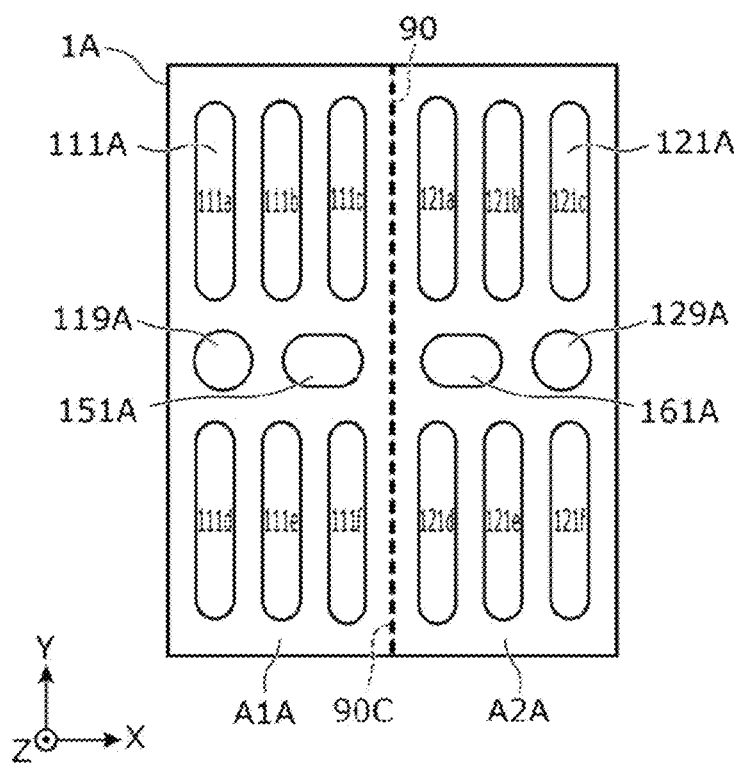
FIG. 15B is a plan view illustrating an example of an arrangement of pads in the semiconductor device according to Embodiment 2.
Figure 16A:
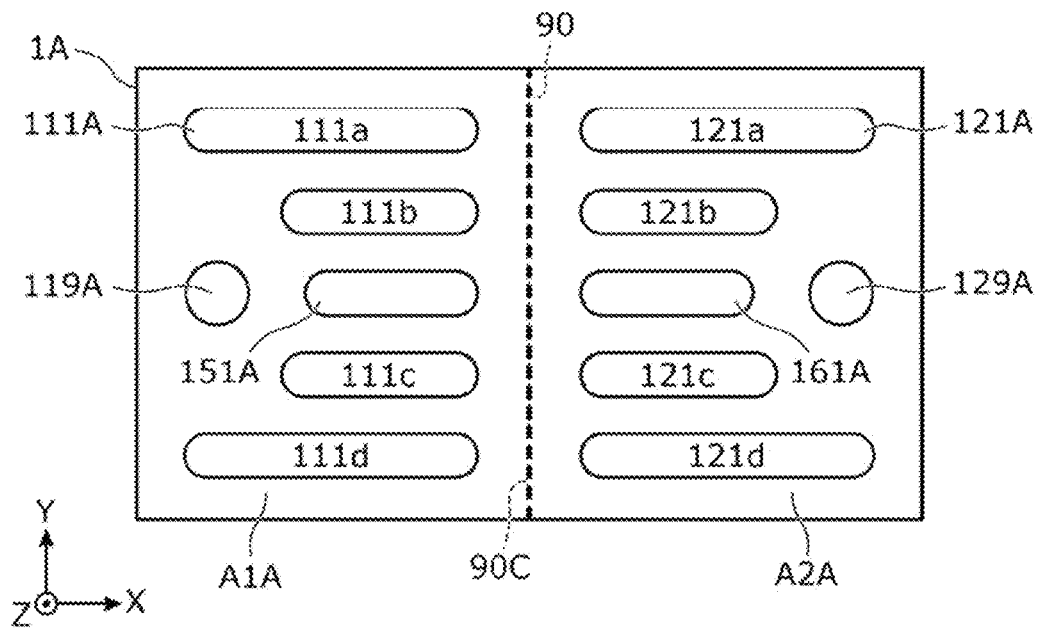
FIG. 16A is a plan view illustrating an example of an arrangement of pads in the semiconductor device according to Embodiment 2.
Figure 16B:
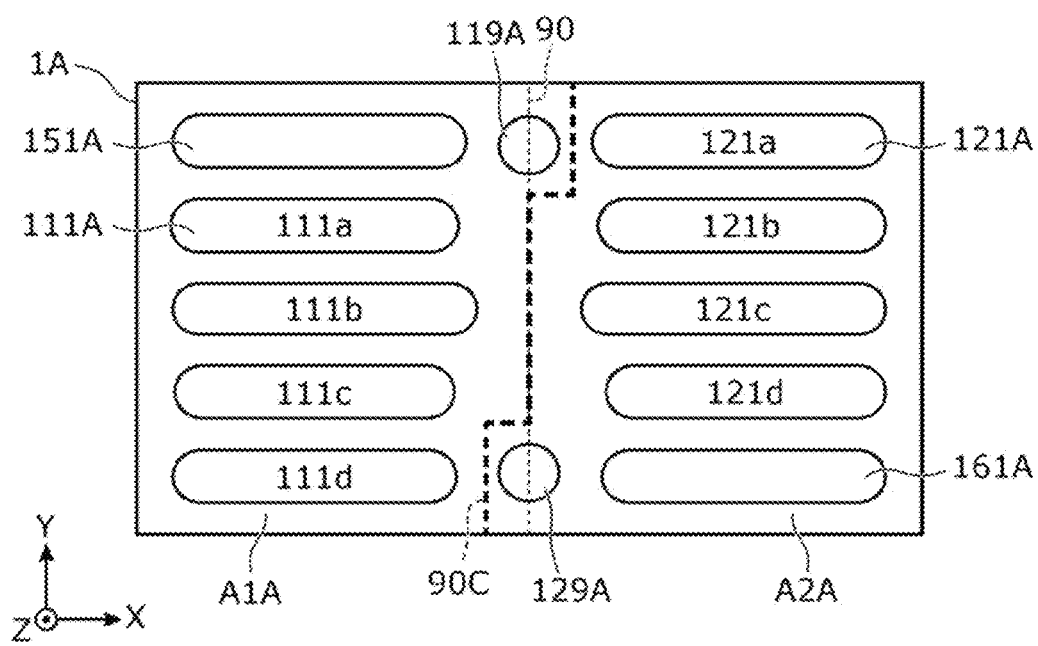
FIG. 16B is a plan view illustrating an example of an arrangement of pads in the semiconductor device according to Embodiment 2.
Figure 16C:
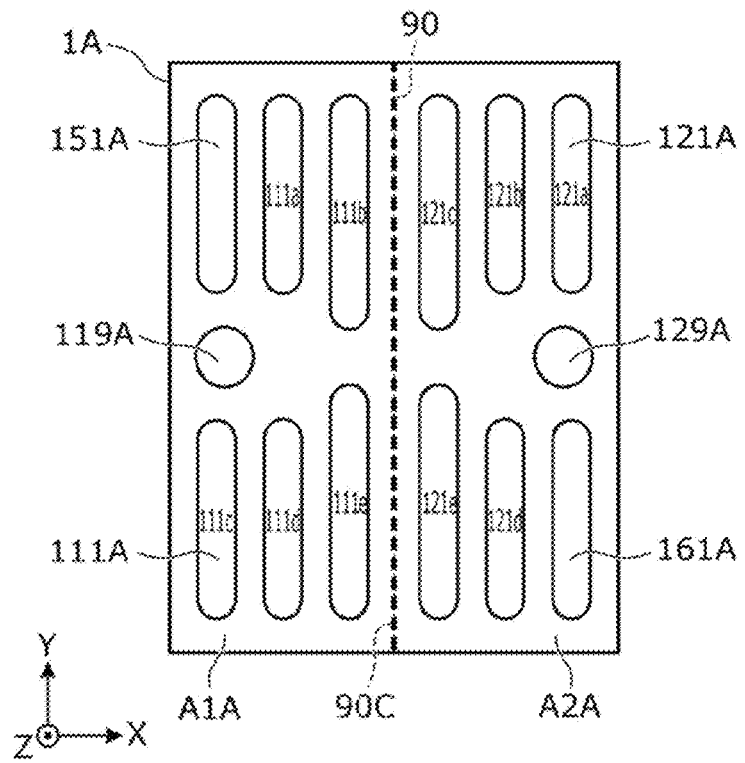
FIG. 16C is a plan view illustrating an example of an arrangement of pads in the semiconductor device according to Embodiment 2.
Figure 16D:
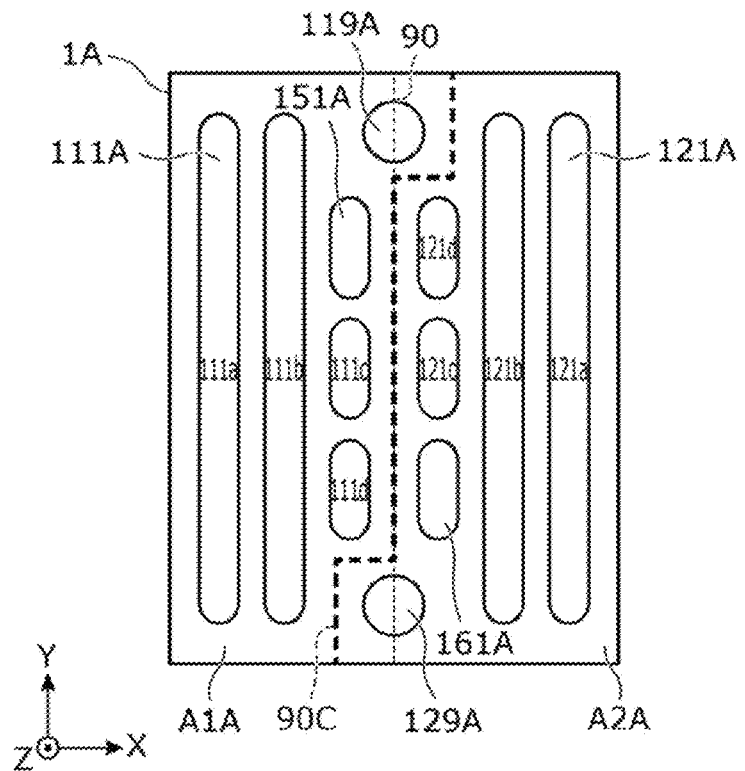
FIG. 16D is a plan view illustrating an example of an arrangement of pads in the semiconductor device according to Embodiment 2.

As shown in FIG. 15A and FIG. 15B, first drain pad 151A and first gate pad 119A may be arranged in a direction orthogonal to border line 90C, second drain pad 161A and second gate pad 129A may be arranged in the direction orthogonal to border line 90C, and a middle point of a line segment that connects the center of first drain pad 151A and the center of second drain pad 161A may coincide with the center of semiconductor layer 40.

According to the above-described configuration, since it is possible to dispose first drain pad 151A and second drain pad 161A to be line-symmetrical with reference to border line 90C as the symmetrical axis, the lack of balance in electrical characteristics of the bidirectional conduction and heat dissipation property between transistor 10A and transistor 20A is less likely to occur. In addition, since first drain pad 151A and first gate pad 119A are disposed to at least partially overlap each other in the first direction in which the principal current flows, it is possible to prevent each of first drain pad 151A and first gate pad 119A from becoming a factor in individually blocking the principal current, compared to a case in which first drain pad 151A and first gate pad 119A are arranged in a direction parallel to border line 90C.

It should be noted that, as shown in FIG. 16A to FIG. 16D, first drain pad 151A and the plurality of first source pads 111A may be disposed at regular intervals in a first band pattern, first drain pad 151A and the plurality of first source pads 111A may have the same width in a direction in which the first band pattern is formed, second drain pad 161A and the plurality of second source pads 121A may be disposed at regular intervals in a second band pattern, and second drain pad 161A and the plurality of second source pads 121A may have the same width in a direction in which the second band pattern is formed. Additionally, the first band pattern and the second band pattern may be the same band pattern.

In an arrangement as described above, it is possible to replace one of the plurality of first source pads 111A and one of the plurality of second source pads 121A with first drain pad 151A and second drain pad 161A, respectively. Accordingly, when usage that does not require the secondary pathway is switched to usage that requires the secondary pathway, it is possible to use semiconductor device 1A without significantly changing an arrangement of wires in the mounting substrate.

Embodiment 3

Semiconductor device 1B according to Embodiment 3 that is configured by changing part of semiconductor device 1A according to Embodiment 2 is described below. Constituent elements of semiconductor device 1B according to Embodiment 3 that are similar to those of semiconductor device 1A are assigned the same reference signs, and the detailed description thereof is omitted, because they have already been described. The following mainly describes differences from semiconductor device 1A.

Figure 17A:
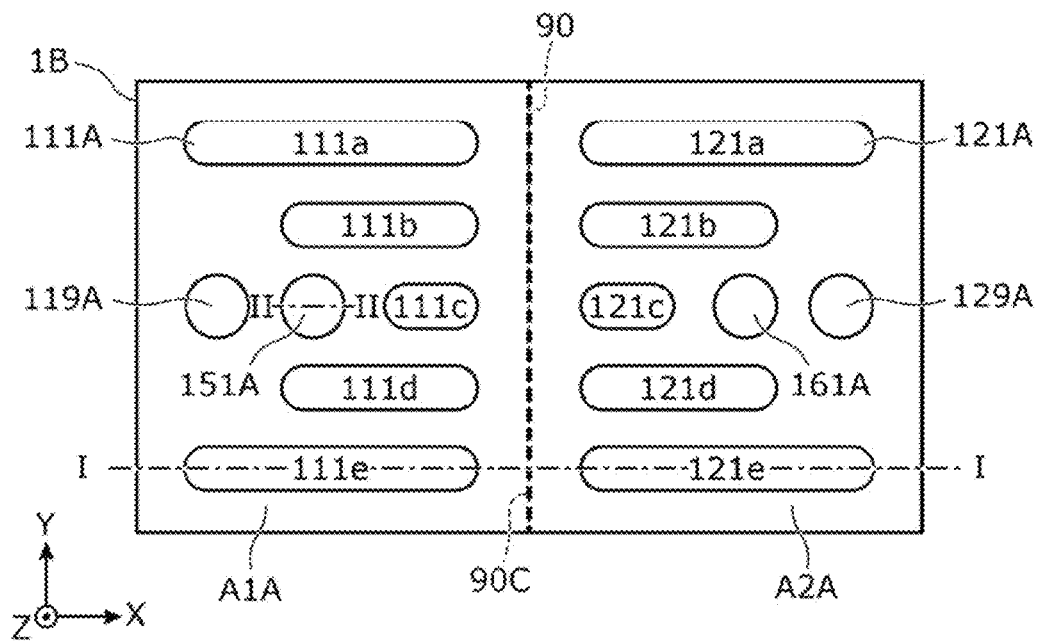
FIG. 17A is a plan view illustrating an example of an arrangement of pads in a semiconductor device according to Embodiment 3.
Figure 17B:
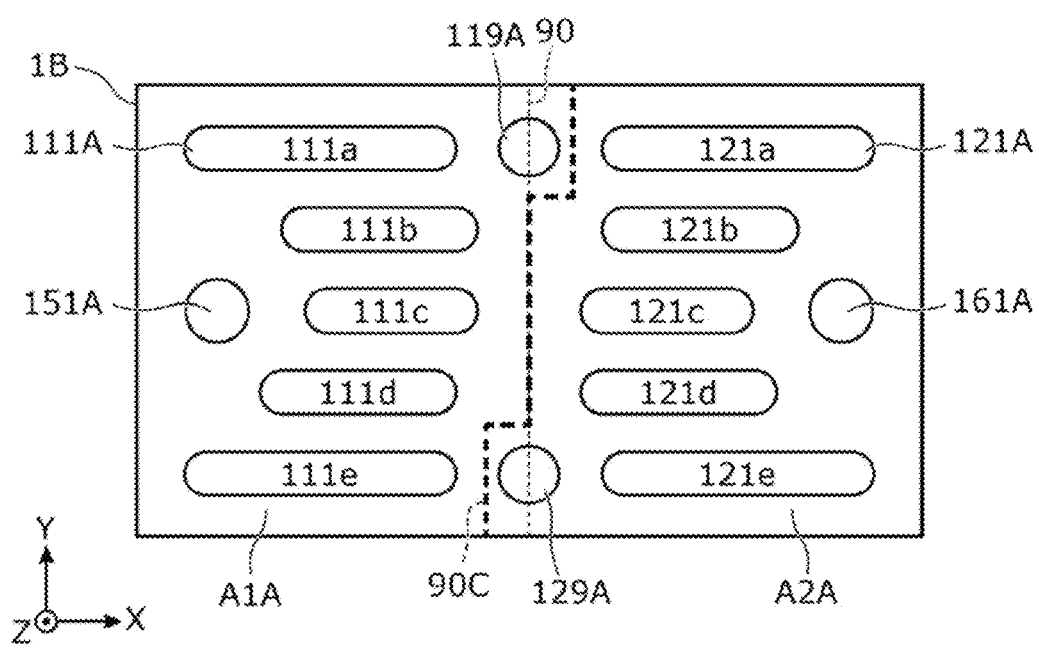
FIG. 17B is a plan view illustrating an example of an arrangement of pads in the semiconductor device according to Embodiment 3.

FIG. 17A is a plan view illustrating an example of an arrangement of pads in semiconductor device 1B according to Embodiment 3. The size and shape of semiconductor device 1B are an example except that semiconductor device 1B is in a rectangular shape. Additionally, the sizes, shapes, and arrangement of the pads are also an example. A cross section along line I-I in FIG. 17A is equivalent to FIG. 1. In addition, a cross section along line II-II in FIG. 17A is equivalent to FIG. 3A, and the constituent elements of semiconductor device 1B according to Embodiment 3 are similar to those of semiconductor device 1A according to Embodiment 2.

As shown in FIG. 17A and FIG. 1, semiconductor device 1B includes: semiconductor layer 40; metal layer 41; transistor 10A provided in first region A1A in semiconductor layer 40; and transistor 20A provided in second region A2A in semiconductor layer 40.

The constituent elements of transistor 10A and transistor 20A of semiconductor device 1B according to Embodiment 3 are equivalent to those of transistor 10A and transistor 20A of semiconductor device 1A according to Embodiment 2.

As shown in FIG. 17A, in a plan view of semiconductor layer 40, first region A1A and second region A2A are one region and an other region that are adjacent to each other and divide an area of semiconductor layer 40 in half.

Moreover, in FIG. 17A, a dashed line indicates virtual border line 90C that separates between first region A1A and second region A2A of semiconductor layer 40.

As shown in FIG. 17A, in the plan view of semiconductor layer 40, a middle point of a line segment that connects the center of first drain pad 151A and the center of second drain pad 161A is located on border line 90C of semiconductor device 1B.

It should be noted that, as shown in FIG. 17A showing an example of semiconductor device 1B, a middle point of a line segment that connects the center of first gate pad 119A and the center of second gate pad 129A may be located on border line 90C of semiconductor device 1B.

Moreover, in the plan view of semiconductor layer 40, some of the plurality of first source pads 111A are disposed between first drain pad 151A and border line 90C.

Similarly, in the plan view of semiconductor layer 40, some of the plurality of second source pads 121A are disposed between second drain pad 161A and border line 90C.

A principal current and a primary pathway of semiconductor device 1B according to Embodiment 3 are similar to those of semiconductor device 1 according to Embodiment 1.

Additionally, a secondary current and a secondary pathway of semiconductor device 1B according to Embodiment 3 are similar to those of semiconductor device 1A according to Embodiment 2.

Above-described semiconductor device 1B in the present disclosure has the following characteristics.

Semiconductor device 1B according to one aspect of the present disclosure is facedown mountable, chip-size-package type semiconductor device 1B, semiconductor device 1B including: semiconductor substrate 32; low-concentration impurity layer 33 that is provided on semiconductor substrate 32; first vertical MOS transistor 10A that is provided in first region A1A of semiconductor layer 40 that is a combination of semiconductor substrate 32 and low-concentration impurity layer 33; second vertical MOS transistor 20A that is provided in second region A2A adjacent to first region A1A in a plan view of semiconductor layer 40; a plurality of first source pads 111A that are provided in first region A1A in the plan view and connected to first source electrode 11 of first vertical MOS transistor 10A; first gate pad 119A that is provided in first region A1A in the plan view and connected to first gate electrode 19 of first vertical MOS transistor 10A; first drain pad 151A that is provided in first region A1A in the plan view and connected to first drain electrode 51A of first vertical MOS transistor 10A; a plurality of second source pads 121A that are provided in second region A2A in the plan view and connected to second source electrode 21 of second vertical MOS transistor 20A; second gate pad 129A that is provided in second region A2A in the plan view and connected to second gate electrode 29 of second vertical MOS transistor 20A; second drain pad 161A that is provided in second region A2A in the plan view and connected to second drain electrode 61A of second vertical MOS transistor 20A; and metal layer 41 that is provided in contact with a back surface of semiconductor substrate 32. Semiconductor substrate 32 is a common drain region for first vertical MOS transistor 10A and second vertical MOS transistor 20A. In the plan view, semiconductor layer 40 is in a rectangular shape. In the plan view, first region A1A and second region A2A are one region and an other region that divide an area of semiconductor layer 40 in half. In the plan view, a middle point of a line segment that connects a center of first drain pad 151A and a center of second drain pad 161A is located on border line 90C between first region A1A and second region A2A. In the plan view, at least part of the plurality of first source pads 111A are disposed between first drain pad 151A and border line 90C. In the plan view, at least part of the plurality of second source pads 121A are disposed between second drain pad 161A and border line 90C.

FIG. 17B to FIG. 17D, FIG. 18A, and FIG. 18B are each a plan view illustrating an example of an arrangement of pads that satisfies conditions for semiconductor device 1B according to Embodiment 3.

According to the above-described configuration, in the plan view of semiconductor layer 40, at least some of the plurality of first source pads 111A and at least some of the plurality of second source pads 121A are disposed not to cause first drain pad 151A and second drain pad 161A to be located between (i) the plurality of first source pads 111A and the plurality of second source pads 121A and (ii) border line 90C. Accordingly, since first drain pad 151A and second drain pad 161A are disposed, in the vicinity of border line 90C along which a current density of the principal current increases most, not to block the conduction of the principal current, providing the secondary pathway makes it possible to inhibit an increase in conduction resistance in the primary pathway as much as possible.

Figure 17C:
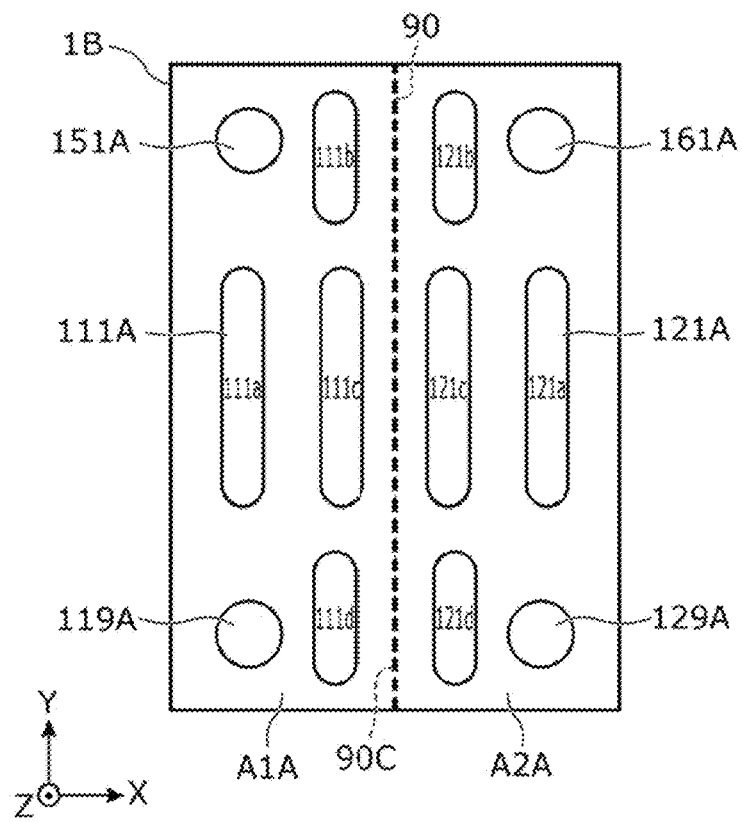
FIG. 17C is a plan view illustrating an example of an arrangement of pads in the semiconductor device according to Embodiment 3.
Figure 17D:
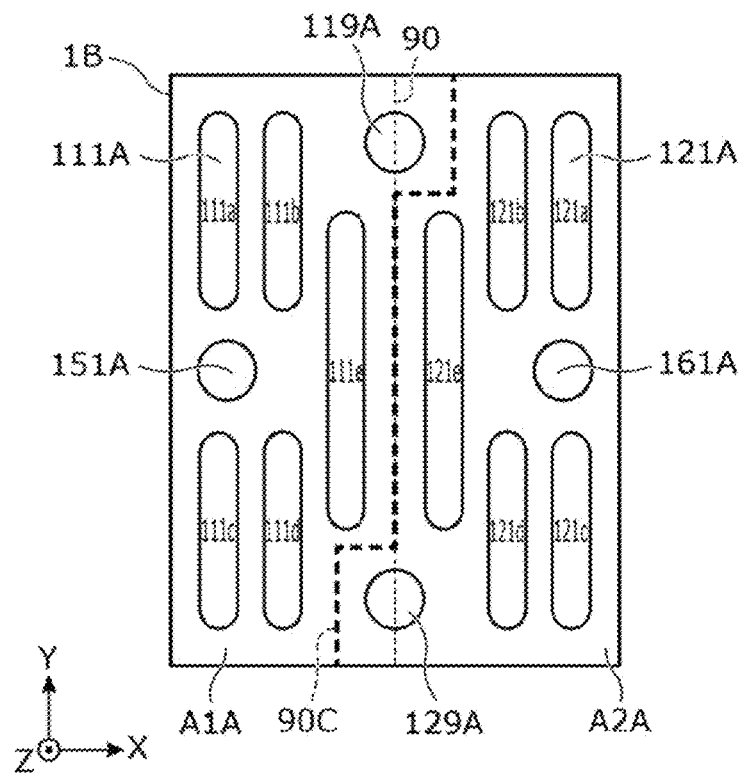
FIG. 17D is a plan view illustrating an example of an arrangement of pads in the semiconductor device according to Embodiment 3.

In particular, in FIG. 17A and FIG. 17C, since the plurality of first source pads 111A and the plurality of second source pads 121A are disposed, over the entire length of border line 90C, to face each other with no other pads interposed therebetween, this is effective in reducing the conduction resistance of the primary pathway.

Figure 18A:
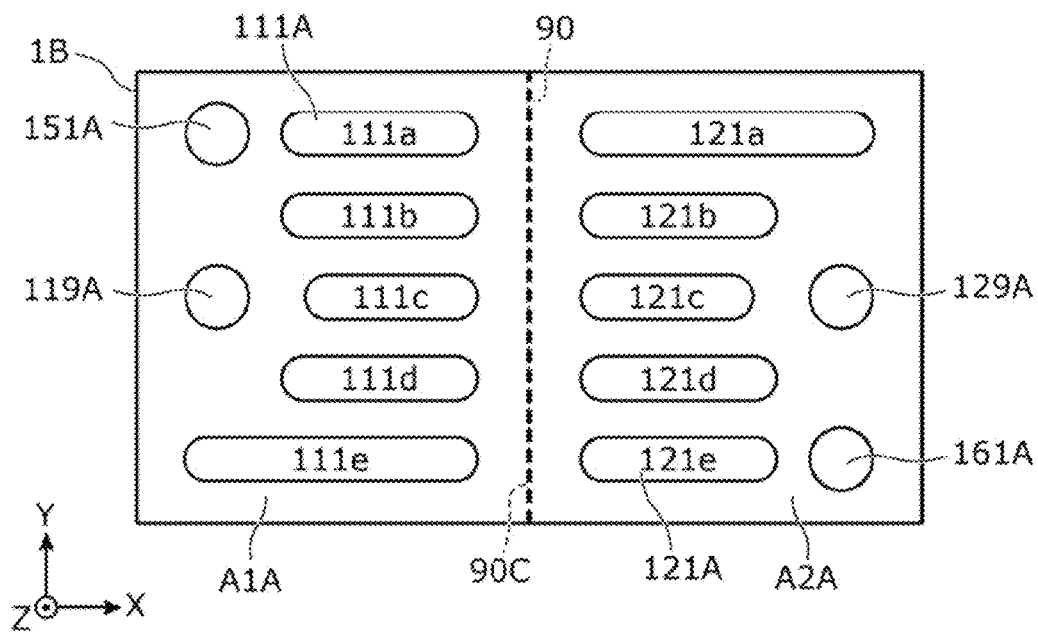
FIG. 18A is a plan view illustrating an example of an arrangement of pads in the semiconductor device according to Embodiment 3.
Figure 18B:
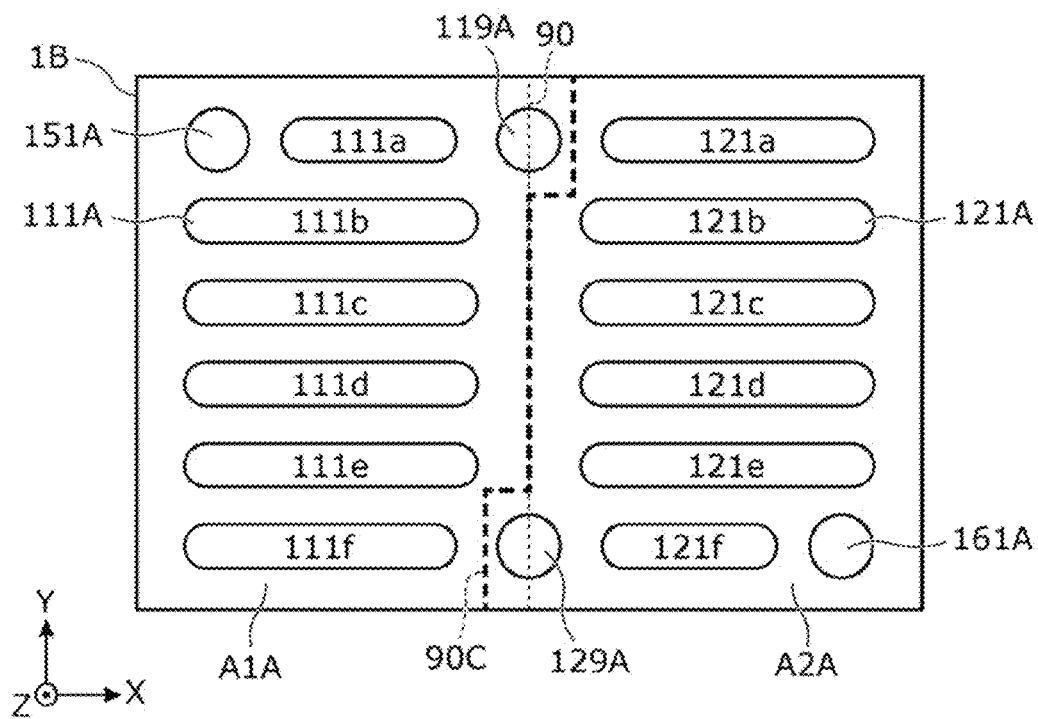
FIG. 18B is a plan view illustrating an example of an arrangement of pads in the semiconductor device according to Embodiment 3.

As shown in FIG. 18A and FIG. 18B, in the plan view of semiconductor layer 40, first drain pad 151A may be disposed closest to a corner portion defined by two intersecting sides among four sides that constitute outer peripheral sides of semiconductor layer 40, and second drain pad 161A may be disposed closest to an other corner portion that is diagonally opposite to the corner portion of semiconductor layer 40 to which first drain pad 151A is disposed closest.

According to the above-described configuration, since it is possible to dispose first drain pad 151A and second drain pad 161A closest to an outer peripheral portion of semiconductor layer 40, it is possible to reduce the possibility of a solder joint defect occurring due to warpage of semiconductor device 1B, compared to a case in which first drain pad 151A and second drain pad 161A are disposed at a central portion of semiconductor layer 40.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device including the vertical MOS transistor according to the present disclosure is widely applicable as a device that controls a conducting state of a current pathway.

The invention claimed is:

1. A semiconductor device that is a facedown mountable, chip-size-package type semiconductor device, the semiconductor device comprising:
a semiconductor substrate;
a low-concentration impurity layer that is provided on the semiconductor substrate;
a first vertical MOS transistor that is provided in a first region of a semiconductor layer that is a combination of the semiconductor substrate and the low-concentration impurity layer;
a second vertical MOS transistor that is provided in a second region adjacent to the first region in a plan view of the semiconductor layer;
a plurality of first source pads that are provided in the first region in the plan view and connected to a first source electrode of the first vertical MOS transistor;
a first gate pad that is provided in the first region in the plan view and connected to a first gate electrode of the first vertical MOS transistor;
a plurality of second source pads that are provided in the second region in the plan view and connected to a second source electrode of the second vertical MOS transistor;
a second gate pad that is provided in the second region in the plan view and connected to a second gate electrode of the second vertical MOS transistor; and
a metal layer that is provided in contact with a back surface of the semiconductor substrate,
wherein the semiconductor substrate is a common drain region for the first vertical MOS transistor and the second vertical MOS transistor,
in the plan view, the semiconductor layer is in a rectangular shape,
in the plan view, the first vertical MOS transistor and the second vertical MOS transistor are arranged in a first direction,
in the plan view, the semiconductor layer includes a third region that does not overlap the first region and the second region,
in the plan view, the first region and the second region are one region and an other region that divide an area of a region of the semiconductor layer excluding the third region in half,
in the plan view, a center of the third region is located on a center line that is straight and orthogonal to the first direction and divides the semiconductor layer in half in the first direction,
in the plan view, the semiconductor layer includes one drain pad that is connected to the common drain region, and
in the plan view, the one drain pad is contained in the third region.

2. The semiconductor device according to claim 1, wherein in the plan view, the first region and the second region are not disposed between the third region and an outer peripheral side of the semiconductor layer, the outer peripheral side being closest to the third region and parallel to the first direction.

3. The semiconductor device according to claim 1, wherein in the plan view, the center of the third region coincides with a center of the semiconductor layer.

4. The semiconductor device according to claim 3, wherein in the plan view, the first gate pad, the second gate pad, and the one drain pad are each in a circular shape, have a same diameter, and have a smallest area among pads included in the semiconductor layer.

5. The semiconductor device according to claim 3, wherein in the plan view, the first gate pad and the second gate pad are each in a circular shape and have a same diameter, and the first gate pad, the second gate pad, and the one drain pad are contained in a same stripe-shaped region.

6. The semiconductor device according to claim 3, wherein in the plan view, the one drain pad is in a substantially rectangular shape, a longitudinal direction of the one drain pad and the center line are parallel to each other, and the longitudinal direction of the one drain pad and a longer-side direction of the semiconductor layer are parallel to each other.

7. A semiconductor device that is a facedown mountable, chip-size-package type semiconductor device, the semiconductor device comprising:
a semiconductor substrate;
a low-concentration impurity layer that is provided on the semiconductor substrate;
a first vertical MOS transistor that is provided in a first region of a semiconductor layer that is a combination of the semiconductor substrate and the low-concentration impurity layer;
a second vertical MOS transistor that is provided in a second region adjacent to the first region in a plan view of the semiconductor layer;
a plurality of first source pads that are provided in the first region in the plan view and connected to a first source electrode of the first vertical MOS transistor;
a first gate pad that is provided in the first region in the plan view and connected to a first gate electrode of the first vertical MOS transistor;
a first drain pad that is provided in the first region in the plan view and connected to a first drain electrode of the first vertical MOS transistor;
a plurality of second source pads that are provided in the second region in the plan view and connected to a second source electrode of the second vertical MOS transistor;
a second gate pad that is provided in the second region in the plan view and connected to a second gate electrode of the second vertical MOS transistor;

a second drain pad that is provided in the second region in the plan view and connected to a second drain electrode of the second vertical MOS transistor; and a metal layer that is provided in contact with a back surface of the semiconductor substrate, wherein the semiconductor substrate is a common drain region for the first vertical MOS transistor and the second vertical MOS transistor, in the plan view, the semiconductor layer is in a rectangular shape, in the plan view, the first region and the second region are one region and an other region that divide an area of the semiconductor layer in half, in the plan view, a middle point of a line segment that connects a center of the first gate pad and a center of the second gate pad is located on a border line between the first region and the second region, in the plan view, a middle point of a line segment that connects a center of the first drain pad and a center of the second drain pad is located on the border line, no portion of the first source pad is disposed between the first gate pad and the first drain pad, and no portion of the second source pad is disposed between the second gate pad and the second drain pad.

8. The semiconductor device according to claim 7, wherein in the plan view, the first gate pad and the first drain pad are arranged in a direction parallel to the border line, and no portion of an other pad is disposed between the first drain pad and an outer peripheral side of the semiconductor layer, the outer peripheral side being closest to the first drain pad, and in the plan view, the second gate pad and the second drain pad are arranged in the direction parallel to the border line, and no portion of an other pad is disposed between the second drain pad and an outer peripheral side of the semiconductor layer, the outer peripheral side being closest to the first drain pad.

9. The semiconductor device according to claim 7, wherein in the plan view, the first gate pad and the first drain pad are arranged in a direction orthogonal to the border line, in the plan view, the second gate pad and the second drain pad are arranged in the direction orthogonal to the border line, and in the plan view, the middle point of the line segment connecting the center of the first drain pad and the center of the second drain pad coincides with a center of the semiconductor layer.

10. The semiconductor device according to claim 7, wherein in the plan view, the first drain pad and the plurality of first source pads are disposed at regular intervals in a first band pattern, the first drain pad and the plurality of first source pads have a same width in a direction in which the first band pattern is formed, in the plan view, the second drain pad and the plurality of second source pads are disposed at regular intervals in a second band pattern, and the second drain pad and the plurality of second source pads have a same width in a direction in which the second band pattern is formed.

11. A semiconductor device that is a facedown mountable, chip-size-package type semiconductor device, the semiconductor device comprising:

a semiconductor substrate;

a low-concentration impurity layer that is provided on the semiconductor substrate;

a first vertical MOS transistor that is provided in a first region of a semiconductor layer that is a combination of the semiconductor substrate and the low-concentration impurity layer;

a second vertical MOS transistor that is provided in a second region adjacent to the first region in a plan view of the semiconductor layer;

a plurality of first source pads that are provided in the first region in the plan view and connected to a first source electrode of the first vertical MOS transistor;

a first gate pad that is provided in the first region in the plan view and connected to a first gate electrode of the first vertical MOS transistor;

a first drain pad that is provided in the first region in the plan view and connected to a first drain electrode of the first vertical MOS transistor;

a plurality of second source pads that are provided in the second region in the plan view and connected to a second source electrode of the second vertical MOS transistor;

a second gate pad that is provided in the second region in the plan view and connected to a second gate electrode of the second vertical MOS transistor;

a second drain pad that is provided in the second region in the plan view and connected to a second drain electrode of the second vertical MOS transistor; and a metal layer that is provided in contact with a back surface of the semiconductor substrate, wherein the semiconductor substrate is a common drain region for the first vertical MOS transistor and the second vertical MOS transistor, in the plan view, the semiconductor layer is in a rectangular shape, in the plan view, the first region and the second region are one region and an other region that divide an area of the semiconductor layer in half, in the plan view, a middle point of a line segment that connects a center of the first drain pad and a center of the second drain pad is located on a border line between the first region and the second region, in the plan view, at least part of the plurality of first source pads are disposed between the first drain pad and the border line, and in the plan view, at least part of the plurality of second source pads are disposed between the second drain pad and the border line.

12. The semiconductor device according to claim 11, wherein in the plan view, the first drain pad is disposed closest to a corner portion defined by two intersecting sides among four sides that constitute outer peripheral sides of the semiconductor layer, and in the plan view, the second drain pad is disposed closest to an other corner portion that is diagonally opposite to the corner portion of the semiconductor layer to which the first drain pad is disposed.

* * * * *